US008665256B2

(12) United States Patent
Omoto et al.

(10) Patent No.: US 8,665,256 B2
(45) Date of Patent: *Mar. 4, 2014

(54) DISPLAY APPARATUS AND DRIVING CONTROLLING METHOD WITH TEMPORARY LOWERING OF POWER SUPPLY POTENTIAL DURING MOBILITY CORRECTION

(71) Applicant: Sony Corporation, Tokyo (JP)

(72) Inventors: Keisuke Omoto, Kanagawa (JP); Masatsugu Tomida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/671,837

(22) Filed: Nov. 8, 2012

(65) Prior Publication Data

US 2013/0069927 A1    Mar. 21, 2013

Related U.S. Application Data

(63) Continuation of application No. 12/662,174, filed on Apr. 5, 2010, now Pat. No. 8,334,864.

(30) Foreign Application Priority Data

May 13, 2009    (JP) ................. 2009-116099

(51) Int. Cl.
    *G06F 3/038*    (2013.01)
    *G09G 5/00*     (2006.01)
    *G09G 3/30*     (2006.01)
(52) U.S. Cl.
    USPC ............................. 345/211; 345/76
(58) Field of Classification Search
    None
    See application file for complete search history.

(56) References Cited

U.S. PATENT DOCUMENTS

| 2003/0227262 | A1  | 12/2003 | Kwon |
| 2004/0046164 | A1  | 3/2004  | Kobayashi et al. |
| 2004/0070557 | A1  | 4/2004  | Asano et al. |
| 2005/0206590 | A1* | 9/2005  | Sasaki et al. ............... 345/76 |
| 2008/0030437 | A1* | 2/2008  | Iida et al. ................. 345/80 |
| 2008/0048955 | A1* | 2/2008  | Yumoto et al. ............ 345/82 |
| 2008/0049053 | A1* | 2/2008  | Asano et al. ............. 345/697 |
| 2009/0046041 | A1* | 2/2009  | Tanikame ................. 345/76 |
| 2009/0201231 | A1* | 8/2009  | Takahara et al. ......... 345/76 |

FOREIGN PATENT DOCUMENTS

| JP | 2002-032035 A | 1/2002 |
| JP | 2003-255856   | 9/2003 |
| JP | 2003-271095 A | 9/2003 |
| JP | 2003-280585 A | 10/2003 |
| JP | 2004-029791   | 1/2004 |
| JP | 2004-093682   | 3/2004 |
| JP | 2004-133240 A | 4/2004 |
| JP | 2008-033194 A | 2/2008 |
| JP | 2009-103871 A | 5/2009 |

OTHER PUBLICATIONS

Japanese Office Action issued Nov. 27, 2012 for corresponding Japanese Application No. 2009-116099.

* cited by examiner

*Primary Examiner* — Bipin Shalwala
*Assistant Examiner* — Ryan A Lubit
(74) *Attorney, Agent, or Firm* — Rader, Fishman & Grauer PLLC

(57) ABSTRACT

Disclosed herein is a display apparatus, including, a pixel array section including a plurality of pixels disposed in rows and columns, and a number of power supply lines and scanning lines equal to the number of the rows of the pixels, each of the power supply lines being wired commonly to those of the pixels which are juxtaposed in a direction of a row.

16 Claims, 18 Drawing Sheets

DISPLAY APPARATUS AND DRIVING CONTROLLING METHOD WITH TEMPORARY LOWERING OF POWER SUPPLY POTENTIAL DURING MOBILITY CORRECTION

FIELD OF THE INVENTION

This is a Continuation Application of U.S. patent application No.: 12/662,174, filed Apr. 5, 2010, which in turn claims priority from Japanese Application No.: 2009-116099 filed in the Japan Patent Office on May 13, 2009, the entire contents of which being incorporated herein by reference.

BACKGROUND OF THE INVENTION

Description of the Related Art

A panel of the planar self-luminous type which uses an organic electroluminescence (EL) element as a light emitting element has been and is being developed energetically in recent years. The organic EL element has a diode characteristic and utilizes a phenomenon that, if an electric field is applied to an organic thin film, then the organic thin film emits light. Since the organic EL element is a self-luminous element whose power consumption is low because it is driven by an applied voltage less than or equal to 10 V and which itself emits light. Therefore, the organic EL element has a characteristic that it does not require an illuminating member and reduction in weight and thickness is easy. Further, since the response speed of the organic EL element is as high as approximately several μs, the EL panel has an advantage that an after-image upon display of a dynamic image does not appear.

Among various EL panels, a panel of the active matrix type wherein a thin film transistor (TFT) as a driving element is formed in an integrated state in each pixel is being developed energetically. An active matrix EL panel is disclosed, for example, in Japanese Patent Laid-Open Nos. 2003-255856, 2003-271095, 2004-133240, 2004-029791 and 2004-093682.

Incidentally, it is generally known that a current-voltage characteristic, that is, an I-V characteristic, of an organic EL element deteriorates as time passes, or in other words, suffers from time-dependent deterioration. In a pixel circuit wherein particularly an N-channel TFT is used as a driving transistor for current-driving an organic EL element, if the I-V characteristic of the organic EL element suffers from time-dependent deterioration, then the gate-source voltage Vgs of the driving transistor varies. Since the source electrode side of the driving transistor is connected to the organic EL element, the emitted light luminance of the organic EL element is varied by the variation of the gate-source voltage Vgs of the driving transistor.

This is described more particularly. Where the organic EL element is connected to the source electrode side of the driving transistor, the source potential of the driving transistor depends upon the operating point of the driving transistor and the organic EL element.

FIGS. 1A and 1B illustrate an operating point of a driving transistor and an organic EL element, respectively. Referring to FIGS. 1A and 1B, the axis of abscissa indicates a drain-source voltage Vds of a driving transistor, and the axis of ordinate indicates source-drain current Ids of the driving transistor.

In an initial state, the driving transistor and the organic EL element have an operating point at a position illustrated in FIG. 1A. Then, if the I-V characteristic of the organic EL element deteriorates, then since the operating point of the driving transistor and the organic EL element varies as is shown in FIG. 1B, even if the same voltage is applied to the gate electrode of the driving transistor, the source potential of the driving transistor varies. This varies the source-gate voltage Vgs of the driving transistor, and consequently, the value of the current to flow to the driving transistor varies. As a result, also the value of current flowing to the organic EL element varies, and consequently, the emitted light luminance of the organic EL element varies.

Further, particularly in a pixel circuit which uses a polycrystalline TFT, in addition to the time-dependent deterioration of the I-V characteristic of the organic EL element, a transistor characteristic of the driving transistor varies as time passes or a transistor characteristic differs among different pixels due to a dispersion in the fabrication process. In particular, individual pixels indicate a dispersion of a transistor characteristic of the driving transistor. The transistor characteristic may be a threshold voltage Vth of the driving transistor, a mobility μ of a semiconductor thin film which forms a channel of the driving transistor, and so forth. It is to be noted that such a mobility μ as described above is hereinafter referred to simply as "mobility μ of the driving transistor."

The transistor characteristic of the driving transistor can be represented by the following expression (1):

$$Ids = \frac{1}{2} \cdot \mu \cdot \frac{W}{L} \cdot Cox \cdot (Vgs - Vth)^2 \qquad (1)$$

where Ids represents the source-drain current of the driving transistor, Vgs the gate-source voltage of the driving transistor, L the channel length, W the gate width, and Cox the gate oxide film capacitance per unit area.

If the threshold voltage Vth or the mobility μ of the driving transistor differs among different pixels, then a dispersion arises in the source-drain current Ids flowing to the driving transistor for each pixel as apparently recognized from the expression (1). As a result, even if the same voltage is applied to the gate electrode of the driving transistor among different pixels, a dispersion in emitted light luminance of the organic EL element appears among the pixels. This damages the uniformity of the screen image.

Thus, a pixel circuit has been proposed which is provided with various correction or compensation functions in order to keep the emitted light luminance of the organic EL element fixed without being influenced by time-dependent deterioration of the I-V characteristic of the organic EL element, a time-dependent variation of a transistor characteristic of the driving transistor and so forth. The pixel circuit of the type described is disclosed, for example, in Japanese Patent Laid-Open No. 2006-133542.

The correction function may be a compensation function for a characteristic variation of the organic EL element, a correction function against a variation of the threshold voltage Vth of the driving transistor, a correction function against a variation of the mobility μ of the driving transistor or a like function. In the following description, correction against a variation of the threshold voltage Vth of the driving transistor is referred to as "threshold value correction," and correction against a variation of the mobility μ of the driving transistor is referred to as "mobility correction."

Where each pixel circuit is provided with various correction functions in this manner, the emitted light luminance of the organic EL element can be kept fixed without being influenced by time-dependent deterioration of the I-V characteristic of the organic EL element or a time-dependent variation of a transistor characteristic of the driving transistor. As a result, the display quality of the display apparatus can be improved.

SUMMARY OF THE INVENTION

However, in the mobility correction, the source-gate voltage Vgs of the driving transistor is adjusted while the source potential of the driving transistor is gradually raised. Therefore, the source-gate voltage Vgs of the driving transistor upon light emission is equal to the difference of the rise amount of the source potential of the driving transistor by the mobility correction from the signal potential of an inputted image signal. Accordingly, if the rise amount of the source potential of the driving transistor by the mobility correction is taken into consideration, then a higher signal potential is required for the image signal to be inputted. This makes a problem that the power consumption increases.

Therefore, it is desirable to provide a display apparatus and a driving controlling method which can reduce power consumption.

According to an embodiment of the present invention, there is provided a display apparatus including a pixel array section including a plurality of pixels disposed in rows and columns, a number of power supply lines and scanning lines equal to the number of the rows of the pixels, each of the power supply lines being wired commonly to those of the pixels which are juxtaposed in a direction of a row, and a power supplying section adapted to supply a predetermined power supply potential to the pixels in the rows through the power supply lines, each of the pixels including a light emitting element having a diode characteristic and adapted to emit light in response to driving current, a sampling transistor adapted to sample an image signal, a driving transistor adapted to supply the driving current to the light emitting element, an accumulating capacitor connected between an anode of the light emitting element and a gate of the driving transistor and adapted to retain a predetermined potential, and an auxiliary capacitor connected between the anode of the light emitting element and the power supply line or the scanning line for an adjacent pixel positioned adjacent the pixel in the direction of a column and adapted to retain a predetermined potential.

In the display apparatus, the auxiliary capacitor of each of the plural pixels disposed in rows and columns is connected between the anode of the light emitting element and the power supply line or the scanning line for an adjacent pixel positioned adjacent the pixel in the direction of a column.

According to another embodiment of the present invention, there is provided a driving controlling method for a display apparatus which includes a pixel array section including a plurality of pixels disposed in rows and columns, a number of power supply lines equal to the number of the rows of the pixels, each of the power supply lines being wired commonly to those of the pixels which are juxtaposed in a direction of a row, and a power supplying section adapted to supply a predetermined power supply potential to the pixels in the rows through the power supply lines and wherein each of the pixels including a light emitting element having a diode characteristic and adapted to emit light in response to driving current, a sampling transistor adapted to sample an image signal, a driving transistor adapted to supply the driving current to the light emitting element, an accumulating capacitor connected between an anode of the light emitting element and a gate of the driving transistor and adapted to retain a predetermined potential, and an auxiliary capacitor connected between the anode of the light emitting element and the power supply line for an adjacent pixel positioned adjacent the pixel in the direction of a column and adapted to retain a predetermined potential, including a step executed by the power supplying section of temporarily lowering, during mobility correction of the pixel, the power supply potential of the power supply line for the adjacent pixel to which the auxiliary capacitor is connected.

In the driving controlling method, the power supply potential of the power supply line for an adjacent pixel which is positioned adjacent the pixel during the mobile correction in the direction of a column and to which the auxiliary capacitor of the pixel is connected is temporarily dropped.

With the display apparatus and the driving controlling method for a display apparatus, the power consumption can be reduced. Further, with the display apparatus and the driving controlling method for a display apparatus, a high emitted light luminance can be obtained.

DETAILED DESCRIPTION OF THE PREFERRED EMBODIMENT

Mode of a Display Apparatus on Which the Present Invention Is Based

First, in order to facilitate understandings of the present invention and make the background of the present invention clear, a configuration and operation of a display apparatus on which the present invention is based are described with reference to FIGS. 2 to 4.

Figure 2:
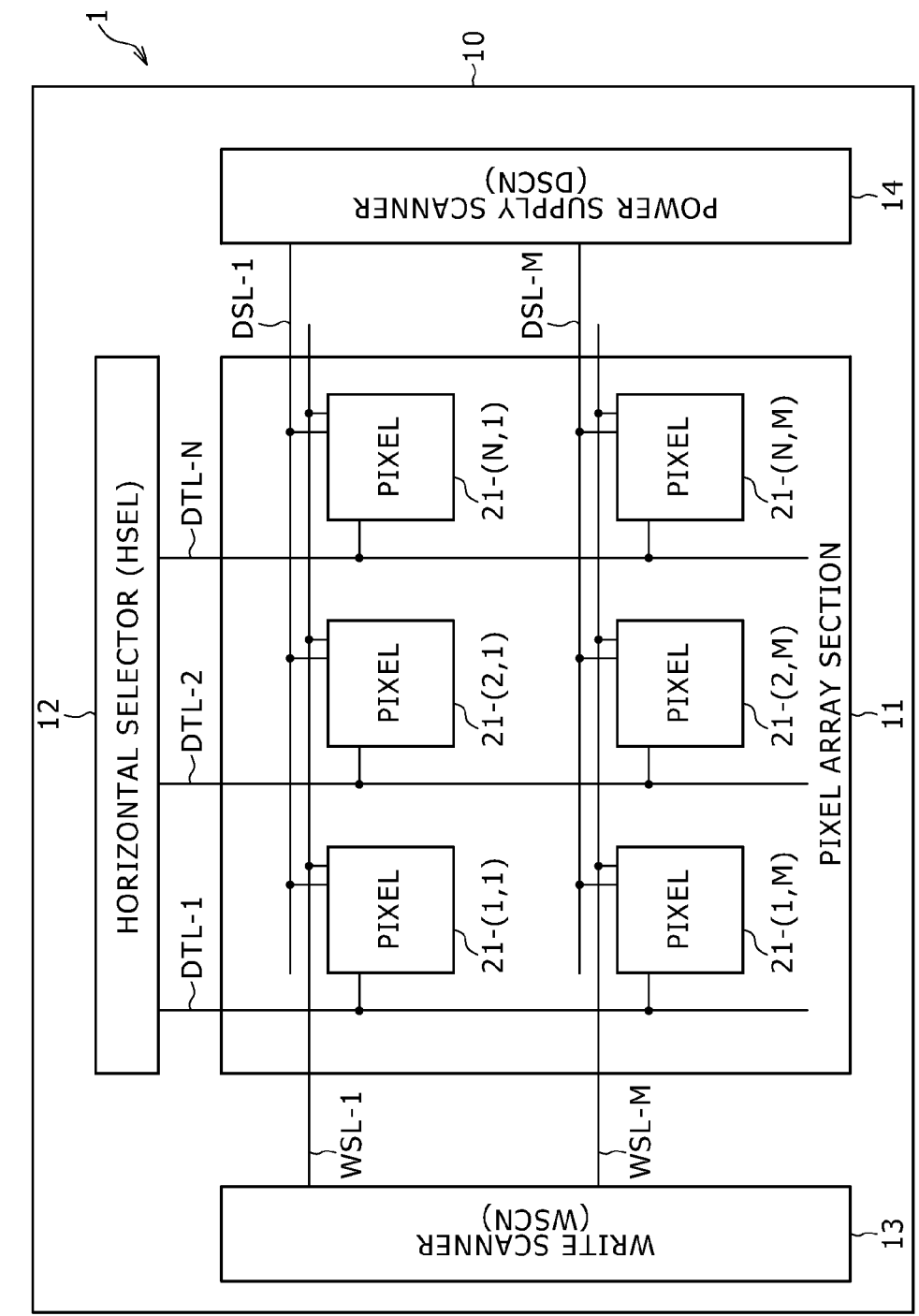
FIG. 2 is a block diagram showing an example of a configuration of a display apparatus on which the present invention is based.

FIG. 2 shows an example of a configuration of a display apparatus on which the present invention is based.

Referring to FIG. 2, the display apparatus 1 shown is, for example, a television receiver and displays an image corresponding to an image signal inputted thereto on an EL panel 10. The EL panel 10 uses an organic EL (electroluminescence) element as a self-luminous element. The EL panel 10 is incorporated as a panel module, which includes a driver IC (integrated circuit) including source drivers and gate drivers, in the display apparatus 1. The display apparatus 1 further includes a power supply circuit, an image LSI (Large Scale Integration) and so forth not shown. It is to be noted that the EL panel 10 of the display apparatus 1 can be utilized also as a display section for a portable telephone set, a digital still camera, a digital video camera, a printer and so forth.

The EL panel 10 includes a pixel array section 11 having a plurality of pixels 21, a horizontal selector (HSEL) 12, a write scanner (WSCN) 13 and a power supply scanner (DSCN) 14.

In the pixel array section 11, N×M (N and M are integral values higher than 1 and independent of each other) pixels 21-(1,1) to 21-(N,M) are disposed in an array. It is to be noted that, from a restriction in illustration, only some of the pixels 21-(1,1) to 21-(N,M) are shown in FIG. 2.

The EL panel 10 further includes M scanning lines WSL-1 to WSL-M, M power supply lines DSL-1 to DSL-M and N image signal lines DTL-1 to DTL-N.

It is to be noted that, in the following description, where there is no necessity to specifically distinguish the scanning lines WSL-1 to WSL-M, each of them is referred to simply as scanning line WSL. Further, where there is no necessity to specifically distinguish the image signal lines DTL-1 to DTL-N, each of them is referred to simply as image signal line DTL. Further, where there is no necessity to specifically distinguish the pixels 21-(1,1) to 21-(N,M) and the power supply lines DSL-1 to DSL-M, each of them is referred to simply as pixel 21 and power supply line DSL, respectively.

The horizontal selector 12, write scanner 13 and power supply scanner 14 operate as a driving section for driving the pixel array section 11.

The pixels 21-(1,1) to 21-(N,1) in the first row from among the pixels 21-(1,1) to 21-(N,M) are connected to the write scanner 13 and the power supply scanner 14 by the scanning line WSL-1 and the power supply line DSL-1, respectively. Further, the pixels 21-(1,M) to 21-(N,M) of the Mth row from among the pixels 21-(1,1) to 21-(N,M) are connected to the write scanner 13 and the power supply scanner 14 by the scanning line WSL-M and the power supply line DSL-M, respectively. In particular, one scanning line WSL and one power supply line DSL are wired commonly to the pixels juxtaposed in the direction of a row. Also the other pixels 21 juxtaposed in the direction of a row in the pixels 21-(1,1) to 21-(N,M) are connected in a similar connection scheme.

Further, the pixels 21-(1,1) to 21-(1,M) in the first column from among the pixels 21-(1,1) to 21-(N,M) are connected to the horizontal selector 12 by the image signal line DTL-1. The pixels 21-(N,1) to 21-(N,M) in the Nth column from among the pixels 21-(1,1) to 21-(N,M) are connected to the horizontal selector 12 by the image signal line DTL-N. In particular, one image signal line DTL is wired commonly to the pixels juxtaposed in the direction of a column. Also the other pixels 21 juxtaposed in the column direction from among the pixels 21-(1,1) to 21-(N,M) are connected in a similar connection scheme.

The write scanner 13 supplies sequential control signals to the scanning lines WSL-1 to WSL-M in a horizontal period (1F) to line-sequentially scan the pixels 21 in a unit of a row. The power supply scanner 14 supplies a power supply potential of a high potential Vcc1 or a low potential Vss illustrated in FIG. 7 to the power supply lines DSL-1 to DSL-M in synchronism with the line-sequential scanning. The horizontal selector 12 supplies a signal potential Vsig corresponding to an image signal and a reference potential Vofs illustrated in FIG. 7 switchably to the image signal lines DTL-1 to DTL-M in the columns within each horizontal period (1F) in synchronism with the line-sequential scanning.

[Array Configuration of the Pixels 21 of the EL Panel 10]

Figure 3:
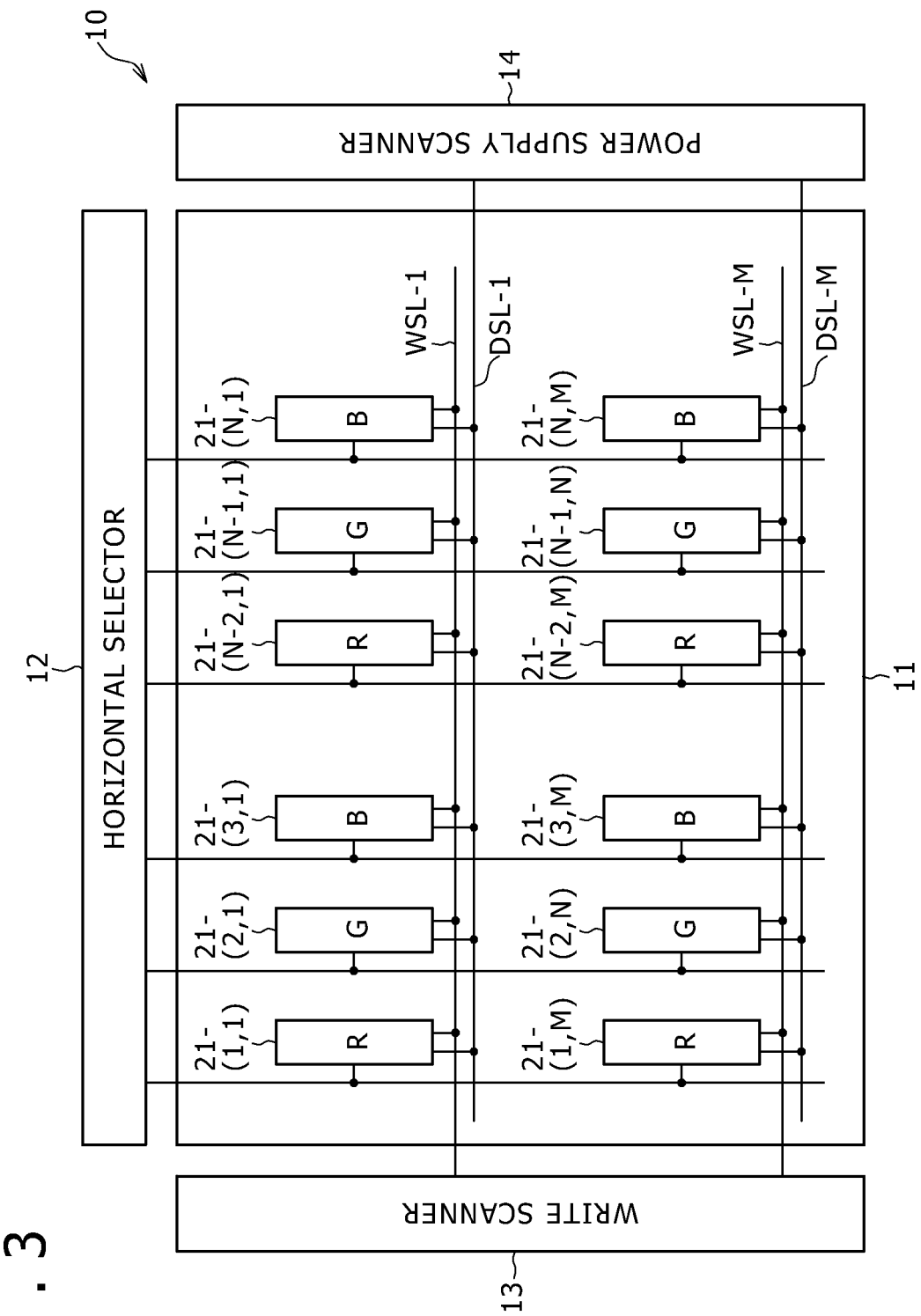
FIG. 3 is a block diagram illustrating an array of colors of pixels of an EL panel shown in FIG. 2.

FIG. 3 shows an array of colors of light emitted from the pixels 21 of the EL panel 10.

It is to be noted that FIG. 3 is different from FIG. 2 in that the scanning lines WSL and the power supply lines DSL are shown connected to the pixels 21 from the lower side. To which side of the pixels 21 the scanning lines WSL, power supply lines DSL and image signal lines DTL are connected can be changed suitably in accordance with the wiring line layout. Also the arrangement of the horizontal selector 12, write scanner 13 and power supply scanner 14 with respect to the pixel array section 11 can be suitably changed similarly.

Each of the pixels 21 of the pixel array section 11 emits light of one of the primary colors of red (R), green (G) and blue (B). The colors are arrayed such that, for example, red, green and blue are arrayed in order in the direction of a row, but in the direction of a column, the same color appears in the same column. Accordingly, the pixels 21 correspond to so-called subpixels, and one pixel as a unit of display is formed from three pixels 21 of red, green and blue juxtaposed in the direction of a row, that is, in the leftward and rightward direction in FIG. 3. It is to be noted that the array of colors of the EL panel 10 is not limited to the specific array shown in FIG. 3.

[Detailed Circuit Configuration of the Pixels 21 of the EL panel 10]

Figure 4:
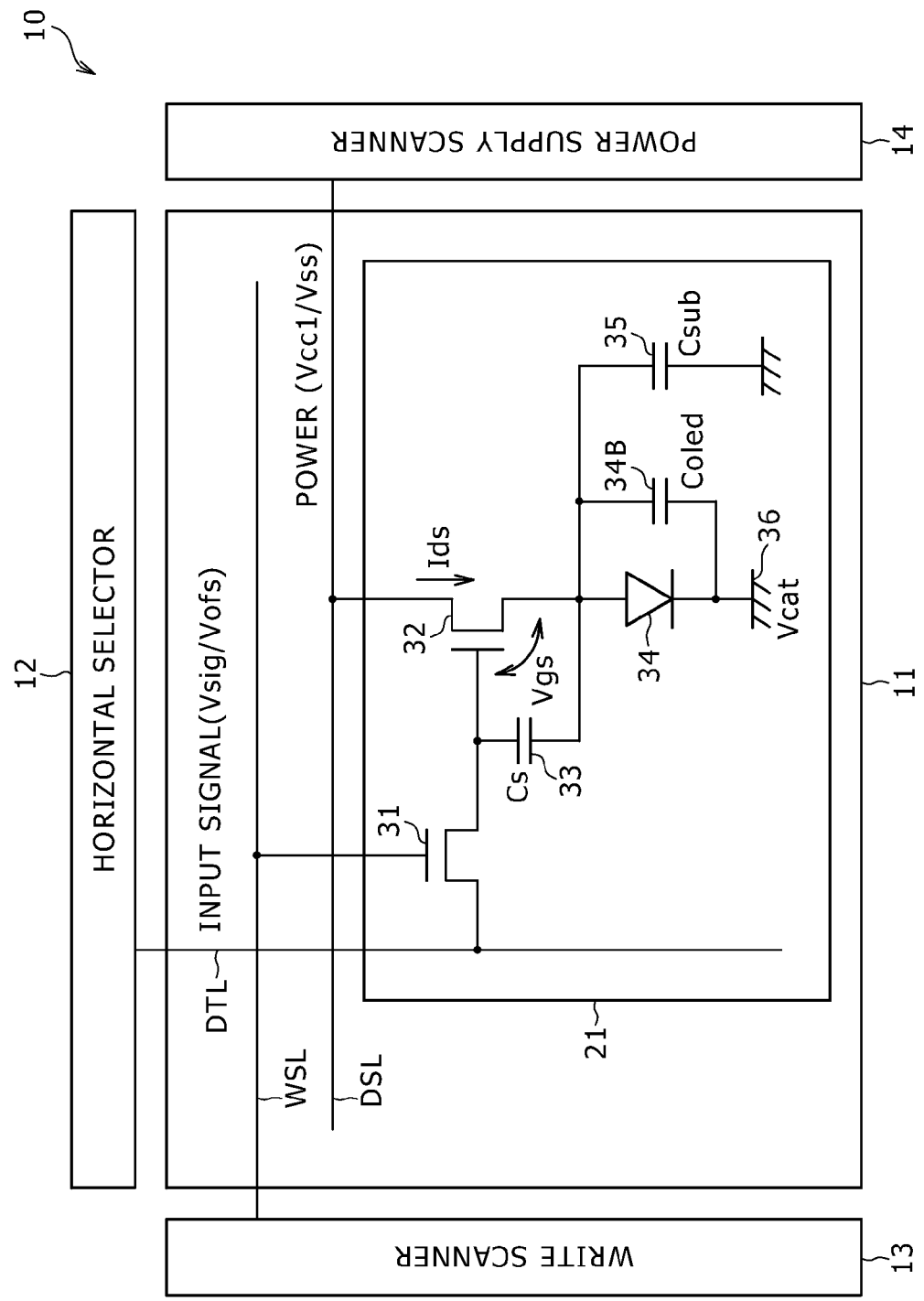
FIG. 4 is a block diagram showing a configuration of an equivalent circuit of a pixel shown in FIG. 2.

FIG. 4 shows a configuration of an equivalent circuit of a pixel circuit of one of the N×M pixels 21 included in the EL panel 10.

It is to be noted that, if the pixel 21 shown in FIG. 4 is a pixel 21-$(n,m)$ (n=1, 2, ..., N and m=1, 2, ..., M), then the scanning line WSL, image signal line DTL and power supply line DSL are such as follows. In particular, the scanning line WSL, image signal line DTL and power supply line DSL are the scanning line WSL-n, image signal line DTL-n and power supply line DSL-m corresponding to the pixel 21-$(n,m)$, respectively.

The pixel 21 shown in FIG. 4 includes a sampling transistor 31, a driving transistor 32, an accumulating capacitor 33, a light emitting element 34, and an auxiliary capacitor 35. Further, in FIG. 4, also a capacitance component which the light emitting element 34 has is shown as a light emitting element capacitor 34B. Here, the accumulating capacitor 33, light emitting element capacitor 34B and auxiliary capacitor 35 have capacitance values Cs, Coled and Csub, respectively.

The sampling transistor 31 is connected at the gate thereof to the scanning line WSL and at the drain thereof to the image signal line DTL. Further, the sampling transistor 31 is connected at the source thereof to the gate of the driving transistor 32.

The driving transistor 32 is connected at one of the source and the drain thereof to the anode of the light emitting element 34 and at the other of the source and the drain thereof to the power supply line DSL. The accumulating capacitor 33 is connected between the gate of the driving transistor 32 and the anode of the light emitting element 34. Further, the light emitting element 34 is connected at the cathode thereof to a wiring line 36 which is set to a predetermined potential Vcat. The potential Vcat is the ground (GND) level, and accordingly, the wiring line 36 is a grounding line.

The auxiliary capacitor 35 is provided to supplement the capacitance component of the light emitting element 34, that is, the light emitting element capacitor 34B and is connected in parallel to the light emitting element 34. In particular, the auxiliary capacitor 35 is connected at one of electrodes thereof to the anode side of the light emitting element 34 and at the other electrode thereof to the cathode side of the light emitting element 34. Where the auxiliary capacitor 35 is provided and retains a predetermined potential in this manner, the input gain of the driving transistor 32 can be improved. Here, the input gain of the driving transistor 32 is a ratio of a rise amount of the source potential Vs with respect to a rise amount of the gate potential Vg of the driving transistor 32 within a writing+mobility correction period $T_5$ hereinafter described with reference to FIG. 7.

The sampling transistor 31 and the driving transistor 32 are N-channel transistors. Therefore, the sampling transistor 31 and the driving transistor 32 can be formed from amorphous silicon which can be produced at a lower cost than low temperature polycrystalline silicon. Consequently, the pixel circuit can be produced at a reduced cost. Naturally, the sampling transistor 31 and the driving transistor 32 may otherwise be formed from low temperature polycrystalline silicon or single crystal silicon.

The light emitting element 34 is formed from an organic EL element. The organic EL element is a current-driven light emitting element having a diode characteristic. Therefore, the light emitting element 34 emits light of a gradation which depends upon the current value Ids supplied thereto.

In the pixel 21 configured in such a manner as described above, the sampling transistor 31 is turned on or rendered conducting in response to a selection control signal from the scanning line WSL and samples an image signal of the signal potential Vsig corresponding to a gradation through the image signal line DTL. The accumulating capacitor 33 accumulates and retains charge supplied thereto from the horizontal selector 12 through the image signal line DTL. The driving transistor 32 is supplied with current from the power supply line DSL having the high potential Vcc1 and supplies driving current Ids to the light emitting element 34 in response to the signal potential Vsig retained in the accumulating capacitor 33. The predetermined driving current Ids flows to the light emitting element 34, and the pixel 21 emits light.

The pixel 21 has a threshold value correction function. The threshold value correction function is a function of causing the accumulating capacitor 33 to retain a voltage corresponding to a threshold voltage Vth of the driving transistor 32. Where the threshold value correction function is exhibited, an influence of the threshold voltage Vth of the driving transistor 32 which makes a cause of a dispersion for each pixel of the EL panel 10 can be canceled.

The pixel 21 has a mobility correction function in addition to the threshold value correction function described above. The mobility correction function is a function of applying, when the signal potential Vsig is retained in the accumulating capacitor 33, correction to the mobility μ of the driving transistor 32.

Furthermore, the pixel 21 has a bootstrap function. The bootstrap function is a function of causing the gate potential Vg to interlock with the variation of the source potential Vs of the driving transistor 32. Where the bootstrap function is exhibited, the voltage Vgs between the gate and the source of the driving transistor 32 can be maintained fixed.

[Pattern Layout of the Pixel 21]

A pattern layout of the pixel 21 shown in FIG. 4 is described with reference to FIGS. 5 and 6.

Figure 5:
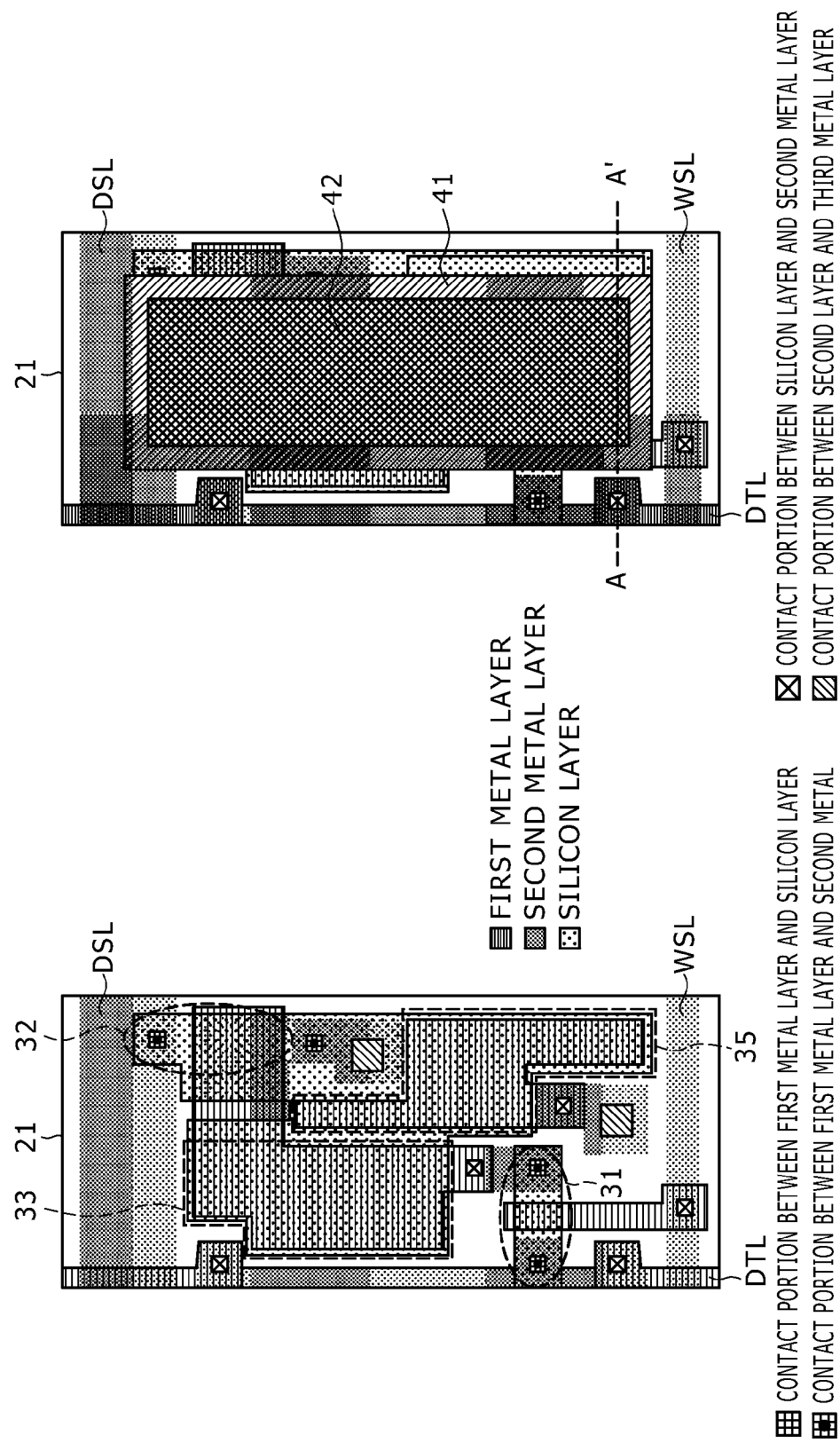
FIG. 5 is a plan view showing a pattern layout of a pixel shown in FIG. 2.

FIG. 5 is a plan view showing a pattern layout of the pixel 21. A view on the left side in FIG. 5 principally shows a pattern layout of a layer which forms a TFT, that is, a TFT layer, and a view on the right side in FIG. 5 principally shows layers on the upper side with respect to the TFT layer.

Figure 6:
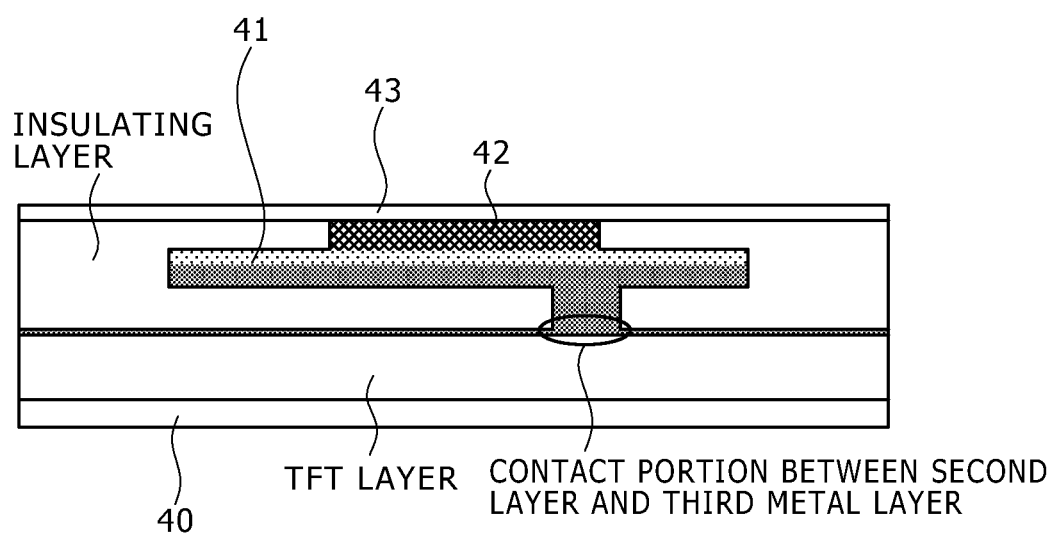
FIG. 6 is a sectional view showing the pattern layout of the pixel of FIG. 5.

FIG. 6 is a sectional view taken along line A-A' of FIG. 5. It is to be noted that, in FIG. 6, the TFT layer is shown in a simplified form.

The pixel 21 includes three metal layers and a semiconductor layer which forms a polycrystalline silicon film. In the following description, the metal layers are referred to as first, second and third metal layers from the nearest side to a substrate 40 shown in FIG. 6 which forms a TFT layer of the pixel 21, and the semiconductor layer which forms the polycrystalline silicon layer is referred to as silicon layer.

As seen from the left side view in FIG. 5, a scanning line WSL and a power supply line DSL which traverse the pixel 21 are formed from the second metal layer. Meanwhile, a image signal line DTL which traverses the pixel 21 is formed, at a portion thereof which does not traverse any of the scanning line WSL and the power supply line DSL, from the second metal layer, but is formed, at another portion thereof which traverses the scanning line WSL and the power supply line DSL, from the first metal layer.

If attention is paid to the sampling transistor 31, then the drain electrode and the source electrode of the sampling transistor 31 are formed from the second metal layer, and the gate electrode of the sampling transistor 31 is formed from the first metal layer. The silicon layer is formed between the drain electrode and source electrode and the gate electrode of the sampling transistor 31. The silicon layer is connected to the second metal layer as the drain electrode and the source electrode of the sampling transistor 31.

If attention is paid to the driving transistor 32, then the drain electrode and the source electrode of the driving transistor 32 are form from the second metal layer, and the gate electrode of the driving transistor 32 is formed from the first metal layer. The silicon layer is formed between the drain electrode and source electrode and the gate electrode of the driving transistor 32. The silicon layer is connected to the second metal layer as the drain electrode and the source electrode of the driving transistor 32.

The accumulating capacitor 33 is formed from the first metal layer and the silicon layer disposed in an opposing relationship to each other. The accumulating capacitor 33 is connected, at one of the electrodes thereof which is formed from the first metal layer, to the source electrode of the sampling transistor 31 through the second metal layer. The accumulating capacitor 33 is connected at the other of the electrodes thereof, which is formed from the silicon layer, to the second metal layer which forms the source electrode of the driving transistor 32. Since the second metal layer which forms the source electrode of the driving transistor 32 is connected to an anode layer 41 shown in FIG. 6 as the third metal layer, the other electrode of the accumulating capacitor 33 formed from the silicon layer is connected to the anode of the light emitting element 34 after all.

Also the auxiliary capacitor 35 is formed from the first metal layer and the silicon layer disposed in an opposing relationship to each other. One of the electrodes of the auxiliary capacitor 35 is formed from the silicon layer commonly to the other electrode of the accumulating capacitor 33 and therefore is connected to the anode layer 41. The auxiliary capacitor 35 is connected at the other electrode thereof to the second metal layer, which in turn is connected to the third metal layer, that is, to the anode layer 41, which electrically has a cathode potential Vcat.

Further, as seen in the view on the right side in FIG. 5 and also in FIG. 6, an organic EL layer 42 is formed on the anode layer 41 as the third metal layer, and a transparent cathode film is formed on the organic EL layer 42.

The pixel 21 can be configured in such a manner as described above.

[Operation of the Pixel 21 of the EL Panel 10]

Figure 7:
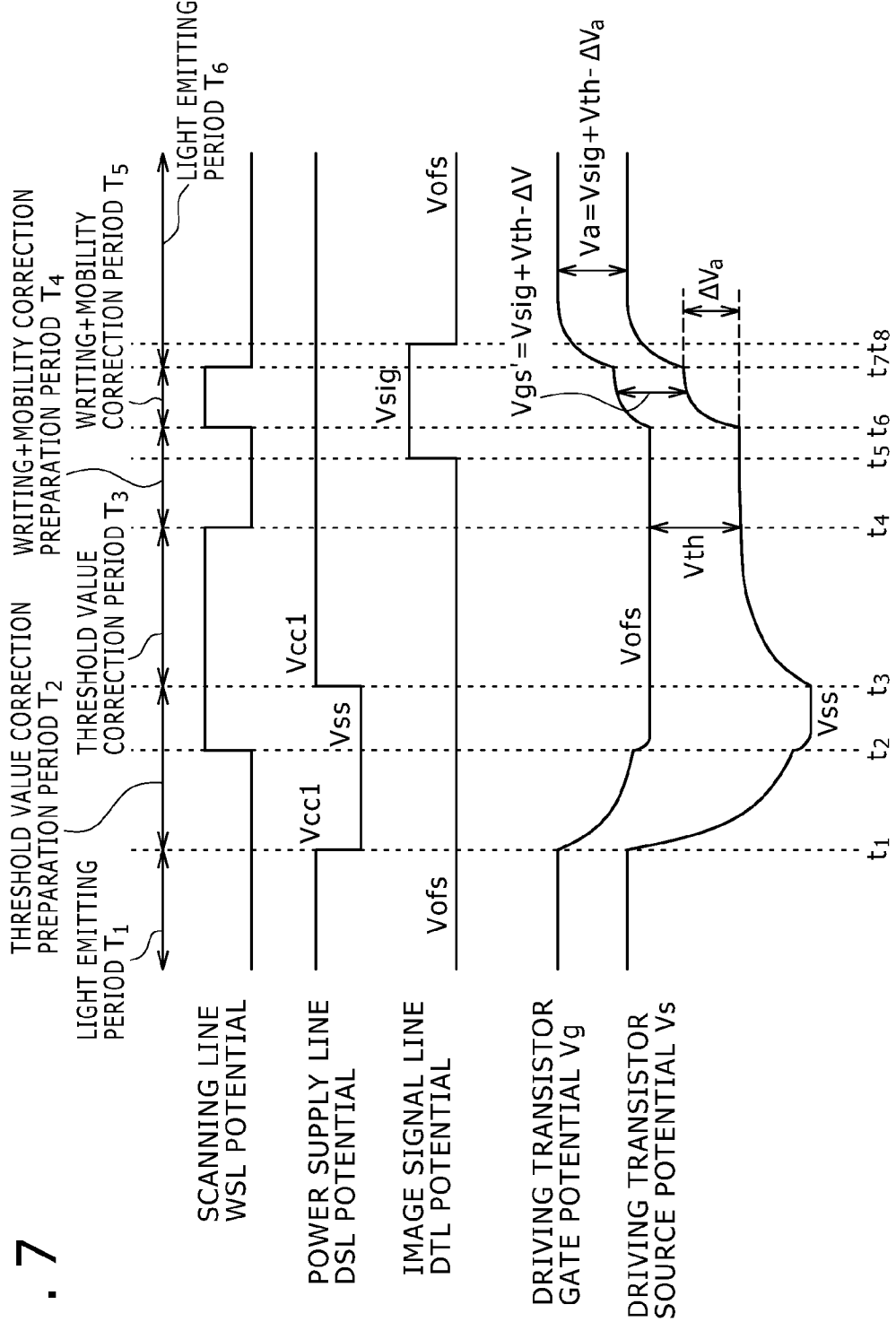
FIG. 7 is a timing chart illustrating operation of a pixel shown in FIG. 2.

FIG. 7 illustrates operation of the pixel 21.

In particular, FIG. 7 illustrates a voltage variation of the scanning line WSL, power supply line DSL and image signal line DTL with respect to the same time axis, which extends in the horizontal direction in FIG. 7 and a corresponding variation of the gate potential Vg and the source potential Vs of the driving transistor 32.

Referring to FIG. 7, the period to time $t_1$ is a light emitting period $T_1$ within which emission of light in the preceding horizontal period (1H) continues.

A period from time $t_1$ at which the light emitting period $T_1$ ends to time $t_2$ is a threshold value correction preparation period $T_3$ within which the gate potential Vg and the source potential Vs of the driving transistor 32 are initialized to make preparations for a threshold voltage correction operation.

Within the threshold value correction preparation period $T_2$, at time $t_1$, the power supply scanner 14 changes over the potential of the power supply line DSL from the high potential Vcc1 to the low potential Vss. Here, the threshold voltage of the light emitting element 34 is represented by Vthel. At this time, if the low potential Vss is set so as to satisfy Vss<Vthel+Vcat, then since the source potential Vs of the driving transistor 32 becomes substantially equal to the low potential Vss, the light emitting element 34 is placed into a reversely biased state and stops emission of light.

Then at time $t_2$, the write scanner 13 changes over the potential of the scanning line WSL to the high potential to turn on the sampling transistor 31. Consequently, the gate potential Vg of the driving transistor 32 is reset to the reference potential Vofs. The source potential Vs of the driving transistor 32 is reset to the low potential Vss of the image signal line DTL over a period of time from time $t_1$ to time $t_2$.

At this time, the gate-source voltage Vgs of the driving transistor 32 becomes Vofs−Vss. Here, if Vofs−Vss is not greater than the threshold voltage Vth of the driving transistor 32, then a next threshold value correction process cannot be carried out. Therefore, the reference potential Vofs and the low potential Vss are set so as to satisfy a relationship of Vofs−Vss>Vth.

A period from time $t_3$ to time $t_4$ is a threshold value correction period $T_3$ within which a threshold value correction operation is carried out. Within the threshold value correction period $T_3$, at time $t_3$, the potential of the power supply line DSL is changed over to the high potential Vcc1 by the power supply scanner 14, and a voltage corresponding to the threshold voltage Vth is written into the accumulating capacitor 33 connected between the gate and the source of the driving transistor 32. In particular, as the potential of the power supply line DSL is changed over to the high potential Vcc1, the source potential Vs of the driving transistor 32 rises and the gate-source voltage Vgs of the driving transistor 32 becomes equal to the threshold voltage Vth before time $t_4$ within the threshold value correction period $T_3$.

It is to be noted that, since the potential Vcat is set so that the light emitting element 34 is placed into a cutoff state within the threshold value correction period $T_3$, the drain-source current Ids of the driving transistor 32 flows to the accumulating capacitor 33 side but not to the light emitting element 34 side.

Within a writing+mobility correction preparation period $T_4$ from time $t_4$ to time $t_6$, the potential of the scanning line WSL is changed over from the high potential to the low potential. At this time, since the sampling transistor 31 is turned off, the gate of the driving transistor 32 is placed into a floating state. However, since the gate-source voltage Vgs of the driving transistor 32 is equal to the threshold voltage Vth, the driving transistor 32 is in a cutoff state. Accordingly, the drain-source current Ids does not flow to the driving transistor 32.

Then, at time $t_5$ after time $t_4$ before time $t_6$, the horizontal selector 12 changes over the potential of the image signal line DTL from the reference potential Vofs to the signal potential Vsig which corresponds to a gradation.

Thereafter, within a writing+mobility correction period $T_5$ from time $t_6$ to time $t_7$, writing of an image signal and a mobility correction operation are carried out at the same time. In particular, within the period from time $t_6$ to time $t_7$, the potential of the scanning line WSL is set to the high potential. Consequently, the signal potential Vsig corresponding to a gradation is written into the accumulating capacitor 33 in such a form that it is added to the threshold voltage Vth. Further, the voltage ΔVa for mobility correction is subtracted from the voltage retained in the accumulating capacitor 33.

The gate-source voltage Vgs' of the driving transistor 32 during mobility correction can be represented by the following expression (2):

$$Vgs' = Vsig + Vth - \Delta V = Vsig + Vth - (Vsig - Vofs)\frac{Cs}{Cs + Csub + Coled} \quad (2)$$

Then, it is assumed that the rise amount ΔV of the source potential Vs of the driving transistor 32 at time $t_7$ at which the writing+mobility correction period $T_5$ ends is $\Delta V_a$. In this instance, if the gate-source voltage Vgs of the driving transistor 32 after the mobility correction is Va, then Va=Vsig+Vth−$\Delta V_a$.

If the values of the gate-source voltage Vgs of the driving transistor 32 during and after the mobility correction are compared with each other, then since the mobility correction raises the source potential Vs of the driving transistor 32, a relationship of Vgs'>Va is satisfied.

It is to be noted that, according to the expression (2), since the rise amount ΔV of the source potential Vs by the mobility correction can be represented by $$\Delta V = (Vsig - Vofs)\frac{Cs}{Cs + Csub + Coled}$$

it can be recognized that, by the provision of the auxiliary capacitor 35 in the pixel 21, the rise amount ΔV can be reduced in comparison with an alternative case wherein the auxiliary capacitor 35 is not provided. In particular, the auxiliary capacitor 35 compensates for the capacitance component of the light emitting element 34 to reduce the rise amount ΔV thereby to increase the gate-source voltage Vgs of the driving transistor 32. As a result of the increase of the gate-source voltage Vgs of the driving transistor 32, where a required emitted light luminance is same, the signal potential Vsig to be applied in accordance with a gradation can be reduced. In other words, the power consumption can be reduced.

At time $t_7$ after the writing+mobility correction period $T_5$ comes to an end, the potential of the scanning line WSL is changed back to the low potential. Consequently, the gate of the driving transistor 32 is disconnected from the image signal line DTL and consequently is placed into a floating state. When the gate of the driving transistor 32 is in a floating state, since the accumulating capacitor 33 is connected between the gate and the source of the driving transistor 32, also the gate potential Vg varies in an interlocking relationship with the variation of the source potential Vs of the driving transistor 32. The operation of the gate potential Vg of the driving transistor 32 which varies in an interlocking relationship with the variation of the source potential Vs is a bootstrap operation by the accumulating capacitor 33.

After time $t_7$, as the gate of the driving transistor 32 is placed into a floating state and the drain-source current Ids of the driving transistor 32 begins to flow as driving current to the light emitting element 34, the anode potential of the light emitting element 34 rises in response to the driving current Ids. Also the gate-source voltage Vg of the driving transistor 32 rises similarly by a bootstrap operation. In particular, the gate potential Vg and the source potential Vs of the driving transistor 32 rise while the gate-source voltage Va of the driving transistor 32, which is equal to Vsig+Vth−ΔVa, is kept fixed. Then, when the anode potential of the light emitting element 34 exceeds Vthel+Vcat, the light emitting element 34 begins to emit light.

At the point of time $t_7$ after the writing+mobility correction period $T_5$ comes to an end, the correction of the threshold voltage Vth and the mobility μ is completed already, and therefore, the luminance of light to be emitted from the light emitting element 34 is not influenced by a dispersion of the threshold voltage Vth or the mobility μ of the driving transistor 32. In particular, the light emitting element 34 emits light with a light luminance equal among the pixels in response to the signal potential Vsig without being influenced by a dispersion of the threshold voltage Vth or the mobility a of the driving transistor 32.

Then, at time $t_8$ after a predetermined period of time elapses after time $t_7$, the potential of the image signal line DTL is dropped to the reference potential Vofs from the signal potential Vsig.

In each of the pixels 21 of the EL panel 10, the light emitting element 34 can be driven to emit light without being influenced by the threshold voltage Vth or the mobility μ of the driving transistor 32 in such a manner as described above. Accordingly, with the display apparatus 1 which uses the EL panel 10, a display image of high quality can be obtained.

Further, in the pixels 21 of the EL panel 10, the rise amount ΔVa of the source potential Vs can be reduced in comparison with an alternative case wherein the auxiliary capacitor 35 is not provided. Consequently, the gate-source voltage Vgs of the driving transistor 32 can be increased. As result of the increase of the gate-source voltage Vgs of the driving transistor 32, the signal potential Vsig to be applied in accordance with a gradation can be reduced, and consequently, the power consumption can be reduce.

Incidentally, in the mobility correction, the gate-source voltage Vgs of the driving transistor 32 is adjusted while the source potential Vs of the driving transistor 32 is gradually raised. Therefore, the gate-source voltage Vgs of the driving transistor 32 upon light emission is given by Vsig+Vth−ΔV$_a$ which is the difference of the rise amount ΔV$_a$ of the source potential Vs by the mobility correction from the gate-source voltage Vgs after writing of the image signal ends. Accordingly, if the rise amount ΔV$_a$ of the source potential Vs by the mobility correction can be further reduced from that in the EL panel 10, then the power consumption can be reduced further.

[Configuration of the Display Apparatus to Which the Present Invention Is Applied]

Thus, a display apparatus which makes it possible to achieve display with a luminance same as that of the display apparatus 1 of FIG. 2 using an image signal of a reduced signal potential Vsig on the basis of the display apparatus 1 described hereinabove with reference to FIG. 2 is described below.

Figure 8:
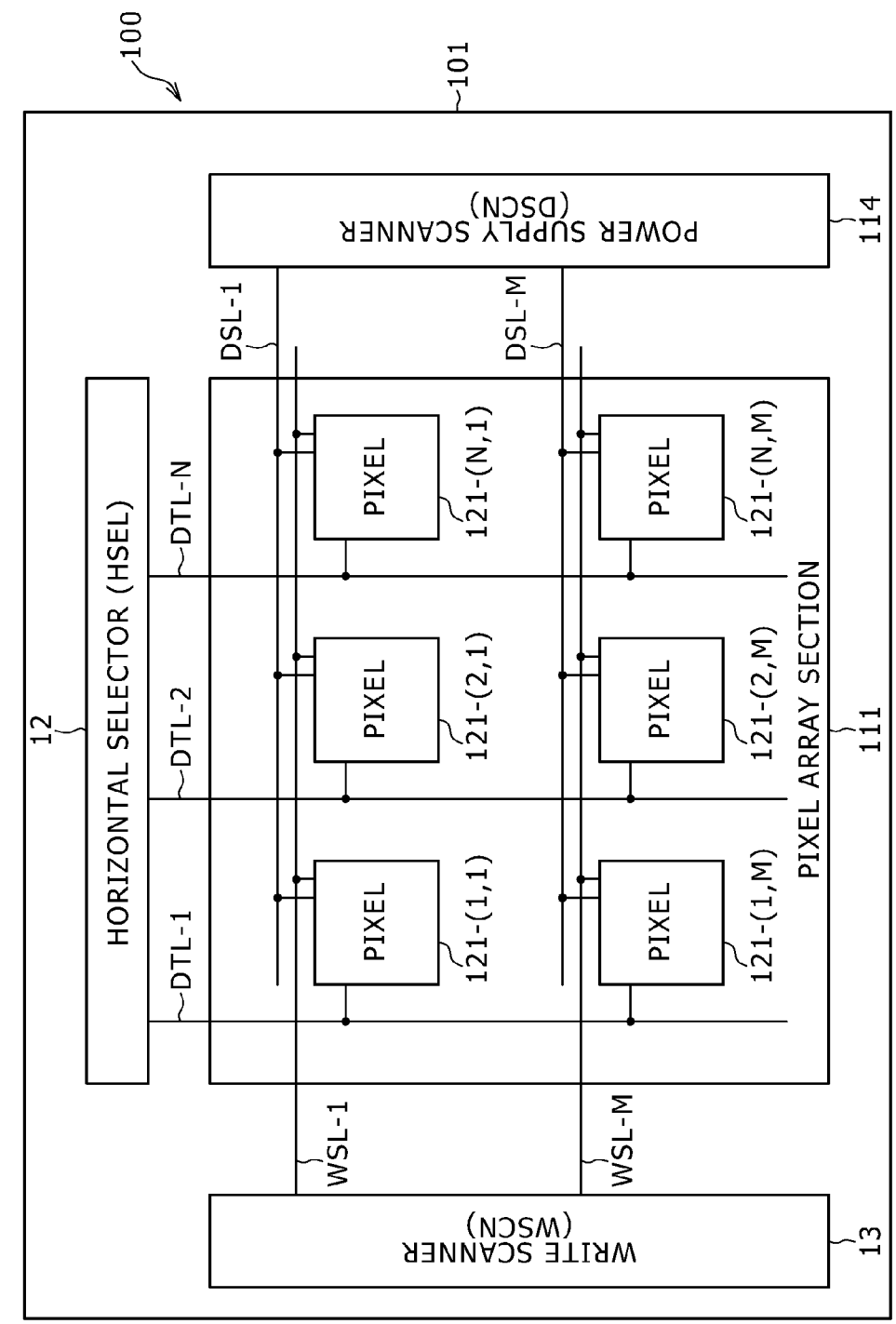
FIG. 8 is a block diagram showing an example of a configuration of a display apparatus to which an embodiment of the present invention is applied.

FIG. 8 illustrates a display apparatus according to an embodiment of the present invention.

Referring to FIG. 8, the display apparatus 100 shown includes an EL panel 101 which is an improvement of the EL panel 10 shown in FIG. 2. The display apparatus 100 has a configuration similar to that of the display apparatus 1 described hereinabove with reference to FIG. 2 except that it includes the EL panel 101 in place of the EL panel 10 shown in FIG. 2.

Like elements in the EL panel 101 to those of the display apparatus 1 are denoted by like reference characters and overlapping description of them is omitted herein to avoid redundancy while only different elements from those of the EL panel 10 are described below.

The EL panel 101 includes a pixel array section 111 having a plurality of pixels 121, a horizontal selector 12, a write scanner 13 and a power supply scanner 114.

The pixel array section 111 includes N×M pixels 121-(1,1) to 121-(N,M) arranged in a matrix similarly as in the EL panel 10. It is to be noted that, where there is no necessity to particularly distinguish the pixels 121-(1,1) to 121-(N,M) from each other, each of them is referred to simply as pixel 121 similarly as in the example described hereinabove.

In the EL panel 101 shown in FIG. 8, the connection of the power supply lines DSL to the pixels 121 and the power supply scanner 114 is different from that in the EL panel 10 shown in FIG. 2 as hereinafter described with reference to FIG. 9. Therefore, also the power supply scanner 114 carries out driving in a different manner from the power supply scanner 14 shown in FIG. 2.

Now, the connection of the power supply lines DSL to the pixels 121 and the power supply scanner 114 and driving of the power supply scanner 114 are described with reference to FIG. 8.

[First Embodiment of the EL Panel 101]

Figure 9:
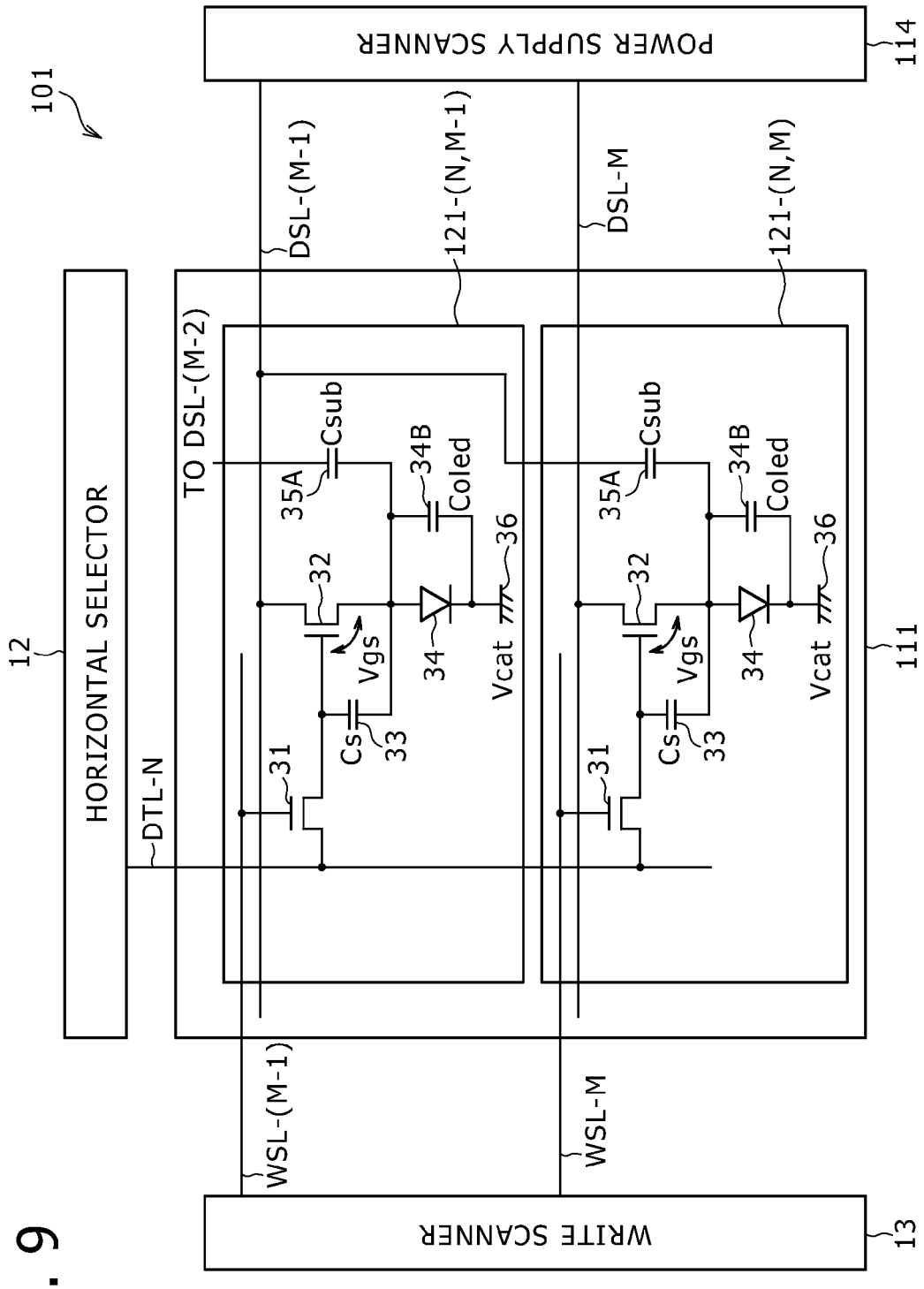
FIG. 9 is a block diagram showing an example of a configuration of an EL panel according to a first embodiment of the present invention.

FIG. 9 shows a configuration example of the EL panel 101 according to a first embodiment.

FIG. 9 particularly shows an equivalent circuit of two pixels 121 juxtaposed in the direction of a column from among the N×M pixels 121 included in the EL panel 101 and shows a configuration of the pixels 121-(N,M−1) and 121-(N,M). It is to be noted that also the other pixels 121 not shown have a similar configuration to that of the pixels 121-(N,M−1) and 121-(N,M).

The pixel 121-(N,M) includes a sampling transistor 31, a driving transistor 32, an accumulating capacitor 33, a light emitting element 34, a light emitting element capacitor 34B and an auxiliary capacitor 35A.

Also the pixel 121-(N,M–1) at the preceding stage, that is, preceding by one row distance, to the pixel 121-(N,M) in line-sequential scanning includes a sampling transistor 31, a driving transistor 32, a accumulating capacitor 33, a light emitting element 34, a light emitting element capacitor 34B and an auxiliary capacitor 35A.

Accordingly, the components of the pixels 121 of the EL panel 101 are similar to those of the pixels 21 of the EL panel 10 described hereinabove with reference to FIG. 4. However, the connection destination of one of the electrodes of the auxiliary capacitor 35A is different from that of the pixel 21 of the EL panel 10 described hereinabove with reference to FIG. 4.

In particular, while, in the pixel 21, one of the electrodes of the auxiliary capacitor 35A is connected to the cathode side in the same pixel, in the pixel 121-(N,M), one of the electrodes of the auxiliary capacitor 35A is connected to the power supply line DSL-(M–1) to the pixel 121-(N,M–1) at the preceding stage. Also the auxiliary capacitor 35A of the pixel 121-(N,M–1) is connected, at the electrode thereof on the opposite side connected to the anode of the light emitting element 34, to the power supply line DSL-(M–2) to the pixel 121-(N,M–2) not shown.

The power supply scanner 114 changes, within a horizontal period (1F) for the pixel 121-(N,M), not only the power supply potential of the power supply line DSL-M but also the power supply potential of the power supply line DSL-(M–1) to the pixel 121-(N,M–1) to which the one electrode of the auxiliary capacitor 35A is connected for a predetermined period of time. Further, the power supply scanner 114 changes, for a horizontal period for the pixel 121-(N,M–1), not only the power supply potential to the power supply line DSL-M but also the power supply potential to the power supply line DSL-(M–2) for the pixel 121-(N,M–2) for a predetermined period of time.

[Operation of the Pixels 121 of the EL Panel 101]

Operation of the pixels 121 is described with reference to FIG. 10 taking the pixel 121-(N,M) from between the two pixels 121-(N,M) and 121 (N,M–1) shown in FIG. 9 as an example.

Figure 10:
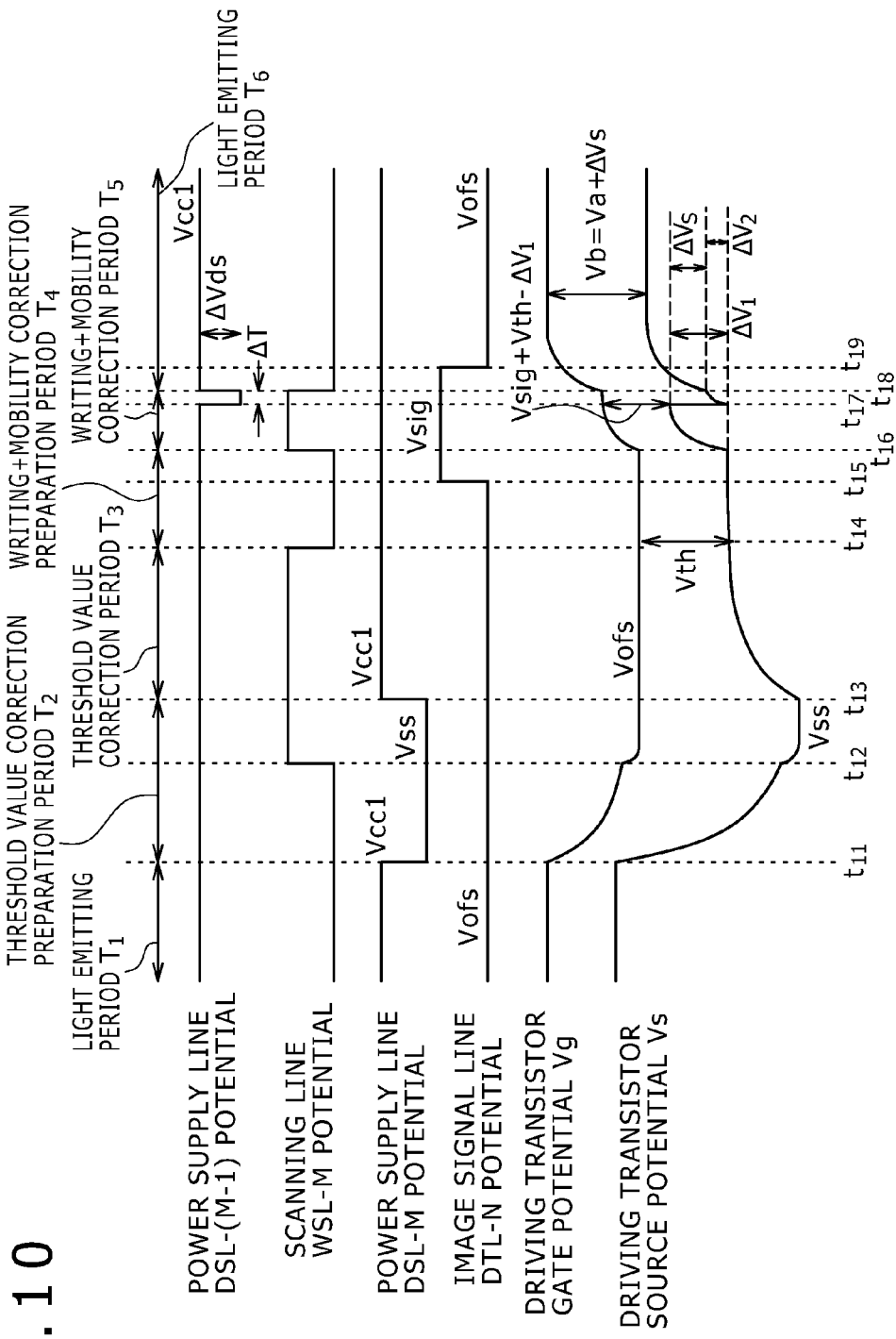
FIG. 10 is a timing chart illustrating operation of a pixel shown in FIG. 9.

FIG. 10 illustrates the potential of the power supply line DSL-(M–1) in addition to the potentials of the scanning line WSL-M, power supply line DSL-M and image signal line DTL-M connected to the pixel 121-(N,M) and the gate potential Vg and the source potential Vs of the driving transistor 32 similar to those illustrated in FIG. 7.

Operation from time $t_{11}$ to time $t_{16}$ is similar to that from time $t_1$ to time $t_6$ illustrated in FIG. 7. Therefore, overlapping description of the operation is omitted herein to avoid redundancy.

As the writing+mobility correction period $T_5$, at time $t_{16}$, the write scanner 13 changes over the potential of the scanning line WSL-M to the high potential to turn on the sampling transistor 31. Consequently, writing of the image signal and mobility correction are started simultaneously. In particular, the signal potential Vsig corresponding to a gradation is written into the accumulating capacitor 33 in such a form as to be added to the threshold voltage Vth. Meanwhile, a voltage ΔV for mobility correction is subtracted from a voltage retained in the accumulating capacitor 33.

At time $t_{17}$ later than a point of time after the writing of the image signal from between the writing of the image signal and the mobility correction started simultaneously ends, the power supply scanner 14 lowers the potential of the power supply line DSL-(M–1) from the high potential Vcc1 by ΔVds. Thereafter, at time $t_{18}$ after lapse of a period of time of ΔT from time $t_{17}$, the power supply scanner 14 changes the potential of the power supply line DSL-(M–1) back to the high potential Vcc1.

Here, it is assumed that the rise amount of the source potential Vs of the driving transistor 32 by the mobility correction from time $t_{16}$ to time $t_{17}$ is $\Delta V_1$. In this instance, the gate-source voltage Vgs of the driving transistor 32 at time $t_{17}$ is Vsig+Vth–$\Delta V_1$.

Since the potential of the power supply DSL-(M–1) drops by ΔVds from a high potential Vcc1 at time $t_{17}$, the source potential Vs of the driving transistor 32 drops by $\Delta V_1$. In particular, since the potential of the power supply line DSL-(M–1) drops by ΔVds from the high potential Vcc1, the rise amount $\Delta V_1$ of the source potential Vs by the mobility correction till then is reset.

However, since the mobility correction operation continues also within the period of time ΔT from time $t_{17}$ to time $t_{18}$, the source potential Vs of the driving transistor 32 rises by $\Delta V_2$ within a period till time $t_{18}$ at which the mobility correction operation ends. As a result, the gate-source voltage Vgs of the driving transistor 32 at time $t_{18}$ at which the mobility correction operation ends is Vb.

Here, the voltage difference $\Delta V_1 - \Delta V_2$ where the rise amount $\Delta V_2$ of the source potential Vs within the time period ΔT from time $t_{17}$ to time $t_{18}$ from the drop amount $\Delta V_1$ of the source potential Vs of the driving transistor 32 at time $t_{17}$ is represented by ΔVs. In this instance, the gate-source potential Vb of the driving transistor 32 after time $t_{18}$ can be represented as Vb=Va+ΔVs because the gate-source voltage Vgs of the driving transistor 32 is higher by the voltage ΔVs than that in the case of FIG. 7.

Further, the voltage ΔVs which is a contribution amount of the drop amount ΔVds of the potential of the power supply line DSL-(M–1) to the gate-source voltage Vgs of the driving transistor 32 can be represented by the following expression (3):

$$\Delta Vs = \Delta Vds \cdot \frac{Cs}{Cs + Csub + Coled} \quad (3)$$

As a result, the gate-source voltage Vgs (=Vb) of the driving transistor 32 at time $t_{18}$ can be represented by the following expression (4):

$$Vgs = Va + \Delta Vs = Vsig + Vth - \Delta V_a + \Delta Vds \cdot \frac{Cs}{Cs + Csub + Coled} \quad (4)$$

Within a light emission period $T_6$ from time $t_{18}$, the gate potential Vg and the source potential Vs of the driving transistor 32 rise while the gate-source voltage Vgs=Vb of the driving transistor 32 is kept fixed similarly as in the EL panel 10. Consequently, the light emitting element 34 emits light.

Accordingly, the display apparatus 100 which adopts the EL panel 101 can expand the gate-source voltage Vgs by the voltage ΔVs from that (Va) of the EL panel 10 of FIG. 7. Consequently, where the required emitted light luminance is same, the signal potential Vsig to be applied in accordance with a gradation can be reduced. In other words, the power consumption can be reduced. Further, mobility correction time longer than that in the case of FIG. 7 can be assured.

However, where the signal potential Vsig is not varied, a higher emitted light luminance can be obtained.

[Relationship between the Dispersion of the Writing+Mobility Correction Period $T_5$ and the Dispersion of the Emitted Light Luminance]

Incidentally, in the EL panel 101, the gate-source voltage Vgs of the driving transistor 32 is expanded by the voltage ΔVs corresponding to the drop amount ΔVds by lowering the potential of the power supply line DSL of the pixel 121 at the preceding stage by the drop amount ΔVds during the mobility correction period of the pixel 121.

However, in the driving control of FIG. 10, the rising rate or gradient itself of the source potential Vs of the driving transistor 32 during the writing+mobility correction period $T_5$ does not vary from that in the case of FIG. 7.

On the other hand, the variation of the gate-source voltage Vgs of the driving transistor 32 only by mobility correction can be represented by the following expression (5) using the elapsed time t from time $t_{16}$ at the beginning of the writing+mobility correction period $T_5$ as a variable:

$$Vgs(t) = Vth + \frac{1}{\frac{1}{Vgs(0) - Vth} + \frac{\beta \cdot t}{2Cs}} \quad (5)$$

where β is a value which represents a coefficient regarding the driving transistor 32 and is given by the following expression (6):

$$\beta = \frac{1}{2} \cdot \mu \cdot \frac{W}{L} \cdot Cox \quad (6)$$

It is to be noted that Vgs(0) in the expression (5) above represents the gate-source voltage Vgs of the driving transistor 32 where the elapsed time t is t=0.

Accordingly, according to the expression (5) given above, as the time t increases, the gate-source voltage Vgs of the driving transistor 32 decreases. In other words, as the writing+mobility correction period $T_5$ becomes longer, the gate-source voltage Vgs of the driving transistor 32 drops. Then, as the gate-source voltage Vgs of the driving transistor 32 drops, the emitted light luminance decreases.

Figure 11:
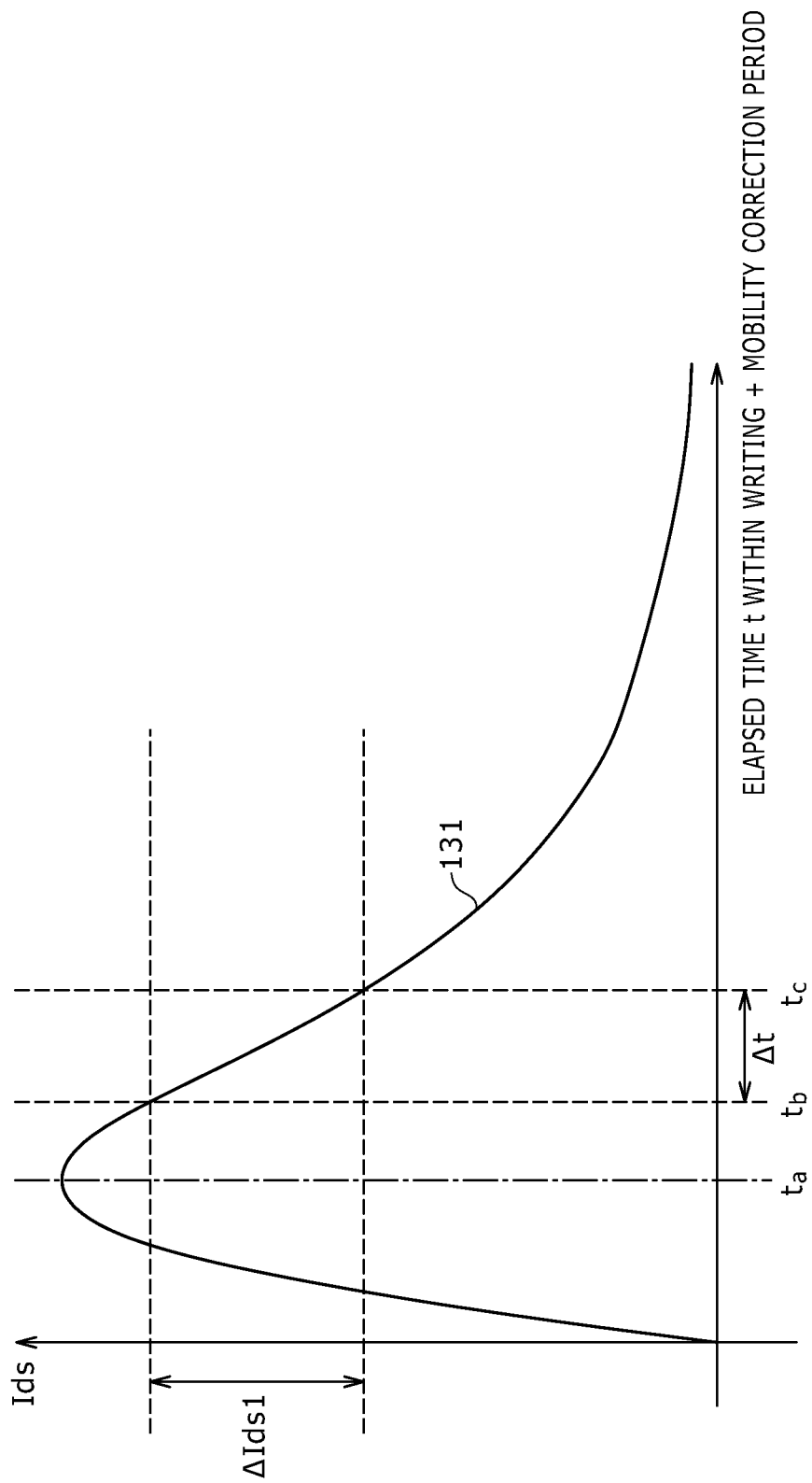
FIG. 11 is a graph illustrating a relationship between the dispersion of a writing+mobility correction period and the dispersion of the emitted light luminance.

FIG. 11 shows a relationship between the elapsed time t within the writing+mobility correction period $T_5$ and the drain-source current Ids of the driving transistor 32.

As mentioned above, within the writing+mobility correction period $T_5$, the EL panel 10 carries out writing of the signal potential Vsig and mobility correction simultaneously. Accordingly, the gate-source voltage Vgs of the driving transistor 32 gradually rises as a whole to time $t_a$ shown in FIG. 11, since the rise thereof by writing of the signal potential Vsig and the drop thereof by the mobility correction somewhat cancel each other. In a corresponding relationship, also the drain-source current Ids of the curve 131 in FIG. 11 rises in response to the time t till time $t_a$.

Then, after time $t_a$ at which the writing of the signal potential Vsig ends, since only the rise of the gate-source voltage Vgs by the mobility correction acts, the gate-source voltage Vgs of the driving transistor 32 gradually decreases. In a corresponding relationship, also the drain-source current Ids indicated with the curve 131 in FIG. 11 decreases in response to the time t after time $t_a$. Then, the gradient of the curve 131 after time $t_a$ corresponds to the rising rate or gradient of the source potential Vs of the driving transistor 32 within the writing+mobility correction period $T_5$ of FIG. 7.

Here, the writing+mobility correction period $T_5$ corresponds to a period within which the scanning line WSL has the high potential as can be recognized by referring to FIGS. 7 and 10. Accordingly, if a dispersion occurs with a transistor characteristic of the sampling transistor 31 or with a characteristic value of a peripheral circuit of the sampling transistor 31, then also the writing+mobility correction period $T_5$ itself suffers from a dispersion.

For example, it is assumed that the writing+mobility correction period $T_5$ ends at time $t_b$ illustrated in FIG. 11 with a certain pixel 21 but ends at time $t_c$ with another certain pixel 21. In particular, it is assumed that a dispersion of a transistor characteristic of the sampling transistor 31 or the like gives rise to a time difference by Δt between the writing+mobility correction periods $T_5$ of the two pixels 21. In this instance, even if threshold value correction or mobility correction is carried out for both of the two pixels 21, a difference ΔIds1 appears in the drain-source current Ids. The difference ΔIds1 of the drain-source current Ids appears as it is as a difference in emitted light luminance.

Accordingly, in the EL panel 101 of the first embodiment described hereinabove, where the pulse width of the selection controlling signal outputted from the write scanner 13 disperses by Δt, there is the possibility that a dispersion may occur with the emitted light luminance.

Thus, the EL panel 101 of the second embodiment of the present invention described below is configured such that, even if a dispersion occurs with the pulse width of the selection controlling signal outputted from the write scanner 13, an otherwise possible dispersion in emitted light luminance is suppressed.

Figure 12:
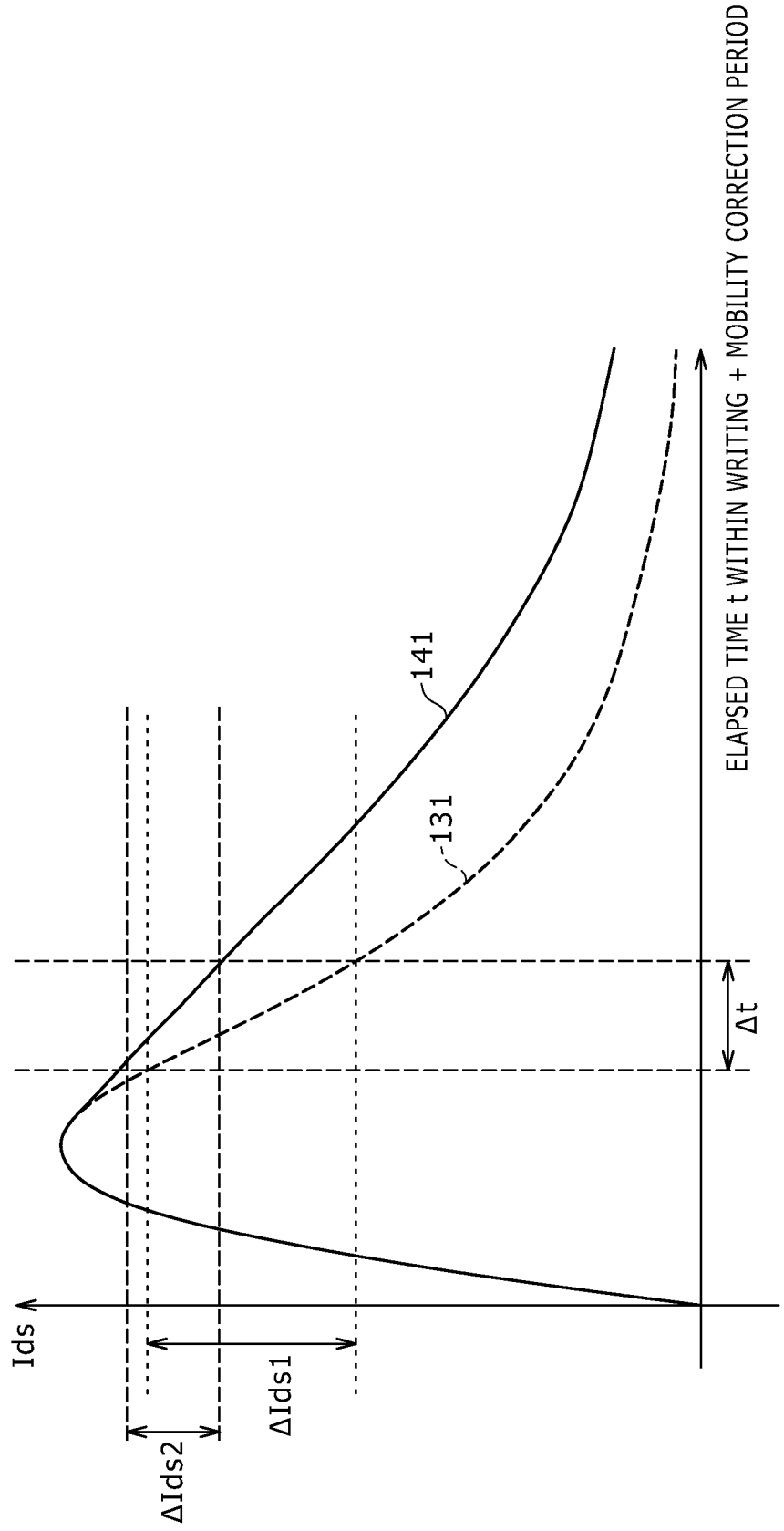
FIG. 12 is a graph illustrating a relationship between the dispersion of a writing+mobility correction period and the dispersion of the emitted light luminance.

FIG. 12 illustrates a relationship between the elapsed time t within the writing+mobility correction period $T_5$ and the drain-source current Ids in the EL panel 101 of the second embodiment described below.

The EL panel 101 of the second embodiment adopts a configuration which makes the gradient after time $t_a$ more moderate than the curve 131 of FIG. 11. By the configuration, even if a dispersion by Δt described hereinabove appears with the pulse width of the selection controlling signal outputted from the write scanner 13, the difference ΔIds2 of the drain-source current Ids is smaller than the difference ΔIds1.

In order to make the gradient of the curve after time $t_a$ more moderate than the curve 131 like a curve 141 of FIG. 12, the drop of the gate-source voltage Vgs of the driving transistor 32 after time $t_a$ should be made moderate. In other words, the rising rate or gradient of the source potential Vs of the driving transistor 32 during the writing+mobility correction period $T_5$ should be made moderate, ideally made zero.

[EL Panel 101 of the Second Embodiment]

Figure 13:
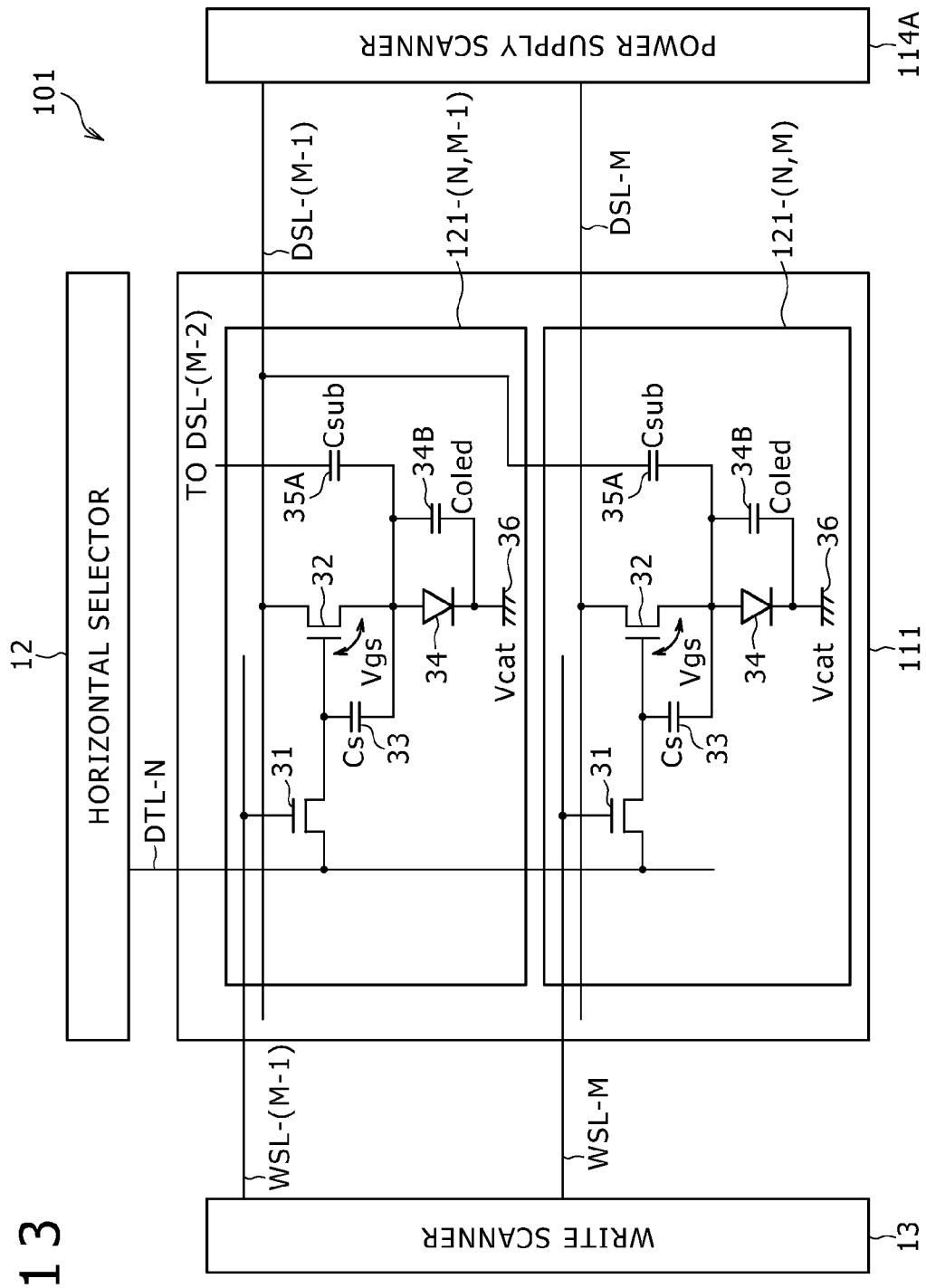
FIG. 13 is a block diagram showing an example of a configuration of an EL panel according to a second embodiment of the present invention.

FIG. 13 shows an example of a configuration of the EL panel 101 according to the second embodiment.

Referring to FIG. 13, the EL panel 101 shown is similar to the EL panel 101 of FIG. 9 according to the first embodiment except only that a power supply scanner 114A is provided in place of the power supply scanner 114 of FIG. 9.

[Operation of the Pixel 121 of the EL Panel 101 of FIG. 13]

Control of the potential of a power supply line DSL by the power supply scanner 114A shown in FIG. 13 is described with reference to FIG. 14.

Figure 14:
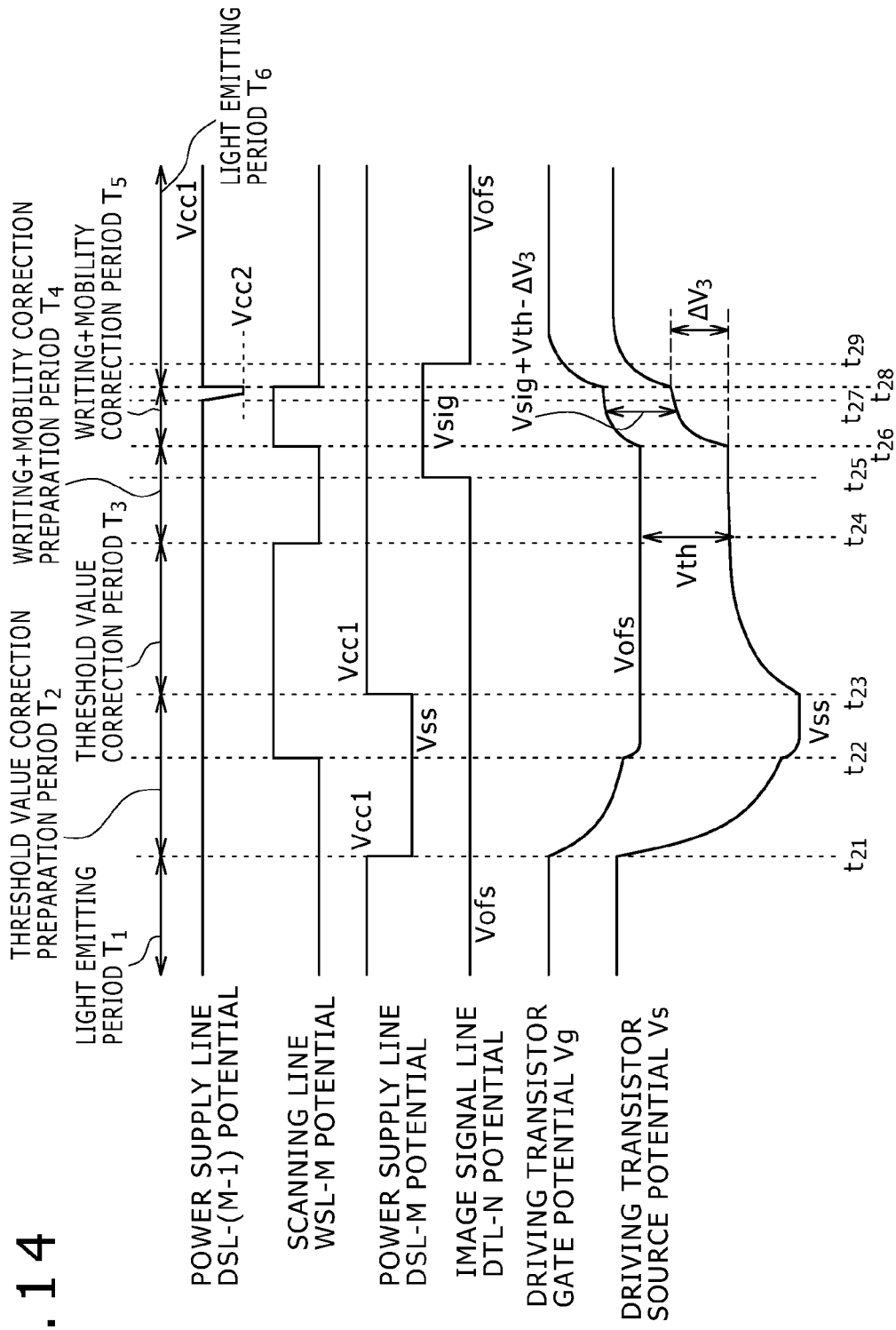
FIG. 14 is a timing chart illustrating operation of a pixel shown in FIG. 13.

In particular, FIG. 14 illustrates operation regarding control of the potential of the power supply line DSL by the power supply scanner 114A shown in FIG. 13.

Time $t_{21}$ to time $t_{29}$ in FIG. 14 correspond to the time $t_{11}$ to time $t_{19}$ of FIG. 10, respectively, and operation of the pixel 121 shown in FIG. 11 within the period is similar to the operation of the pixel 121 shown in FIG. 10. However, the operation is different in that, after time $t_{27}$ within the writing+ mobility correction period $T_5$, the potential of the power supply line DSL-(M−1) moderately drops as time passes and becomes an intermediate potential Vcc2 at a point of time of $t_{28}$. Further, from this difference, the source potential Vs of the driving transistor 32 is substantially fixed within a period from time $t_{27}$ to time $t_{28}$.

Figure 15:
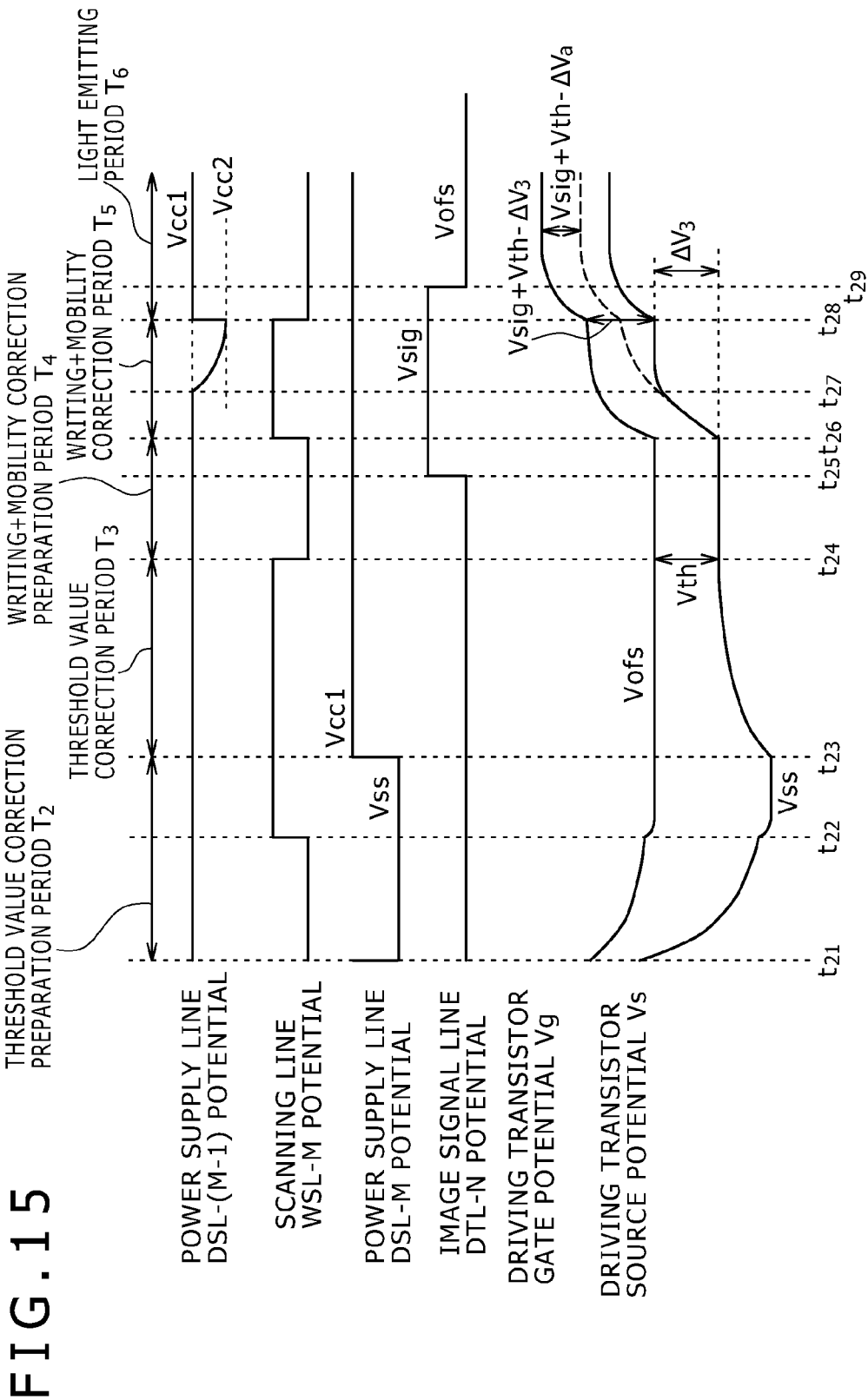
FIG. 15 is a timing chart illustrating operation of a pixel shown in FIG. 13.

The difference between the EL panels 101 of the first and second embodiments is described further with reference to FIG. 15.

FIG. 15 is a view illustrating the period from time $t_{21}$ to time $t_{29}$ in FIG. 14 in an enlarged fashion in the direction of the time axis. It is to be noted that the scale is adjusted suitably to facilitate understandings.

As described above, within the period from time $t_{21}$ to time $t_{27}$, the pixel 121 operates similarly as in the period from time $t_{11}$ to time $t_{17}$ in FIG. 10.

Then at time $t_{27}$, the power supply scanner 114A moderately drops the potential of the power supply line DSL-(M−1) from the high potential Vcc1 so that it becomes equal to the intermediate potential Vcc2 at time $t_{28}$.

As described hereinabove with reference to FIG. 10, if the potential of the power supply line DSL-(M−1) is dropped, then the source potential Vs of the driving transistor 32 drops. Accordingly, by dropping the potential of the power supply line DSL-(M−1) moderately, the source potential Vs of the driving transistor 32 can be kept substantially fixed. Reversely speaking, the gradient of a falling edge of the power supply potential of the power supply line DSL-(M−1) and the intermediate potential Vcc2 at time $t_{28}$ are set such that the source potential Vs of the driving transistor 32 may be substantially fixed for a period of time from time $t_{27}$ to time $t_{28}$.

If the source potential Vs of the driving transistor 32 is substantially fixed for a period of time from time $t_{27}$ to $t_{28}$, then the gradient of the curve after time $t_a$ becomes moderate as seen from the curve 141 of FIG. 12. If the gradient of the curve becomes moderate, then even if the pulse width of the selection controlling signal by the write scanner 13 disperses and the writing+mobility correction period $T_5$ disperses, the dispersion of the emitted light luminance can be suppressed.

If, in FIG. 15, the rise amount of the source potential Vs of the driving transistor 32 within the writing+mobility correction period $t_5$ is $\Delta V_3$, then the gate-source voltage Vgs of the driving transistor 32 at time $t_{28}$ becomes Vsig+Vth−$\Delta V_3$.

In FIG. 15, a variation of the source potential Vs of the driving transistor 32 of the EL panel 10 after time $t_{27}$ is indicated by a broken line. According to the driving control of the EL panel 101 of FIG. 13, the rise of the source potential Vs of the driving transistor 32 after time $t_{27}$ is suppressed to the utmost. Therefore, it can be recognized that, in comparison with the basic EL panel 10, the gate-source voltage Vgs of the driving transistor 32 is expanded. Accordingly, also in the EL panel 101 of the second embodiment, the signal potential Vsig can be dropped and the power consumption can be reduced.

[Example of the Configuration of the Power Supply Scanner 114A]

Figure 16:
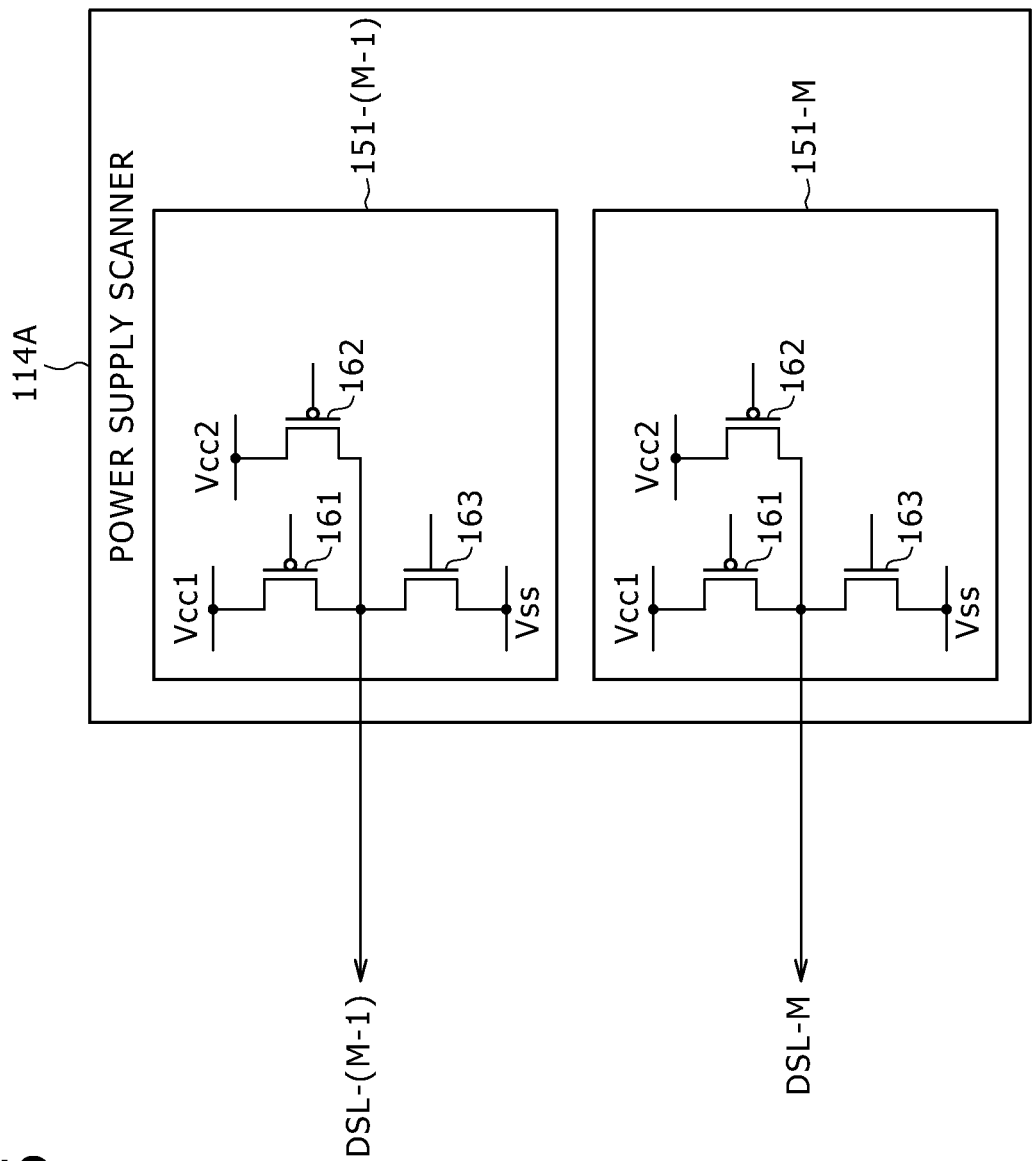
FIG. 16 is a view showing an example of a configuration of a power supply scanner shown in FIG. 13.

FIG. 16 shows an example of a configuration of the power supply scanner 114A which carries such control of the power supply potential as described above with reference to FIG. 15.

It is to be noted that only a portion of the power supply scanner 114A which corresponds to a pixel 121-(N,M−1) and another pixel 121-(N,M).

Referring to FIG. 16, the power supply scanner 114A includes an output circuit 151-M for supplying a predetermined power supply potential to a power supply line DSL-M of the pixel 121-(N,M) and another output circuit 151-(M−1) for outputting the predetermined power supply potential to a power supply line DSL-(M−1) of the pixel 121-(N,M−1).

The output circuit 151-M and the output circuit 151-(M−1) have similar configurations, and therefore, description is given only of the output circuit 151-(M−1).

The output circuit 151-(M−1) includes two P-channel transistors 161 and 162, and one N-channel transistor 163.

The P-channel transistor 161 of the output circuit 151-(M−1) is connected at the source thereof to the high potential Vcc1 and conducts when the control signal inputted to the gate thereof has the low potential Lo thereby to supply the high potential Vcc1 to the power supply line DSL-(M−1).

The P-channel transistor 162 of the output circuit 151-(M−1) is connected at the source thereof to the intermediate potential Vcc2 and conducts when the control signal inputted to the gate thereof is the low potential Lo thereby to supply the intermediate potential Vcc2 to the power supply line DSL-(M−1).

The N-channel transistor 163 of the output circuit 151-(M−1) is connected at the source thereof to the power supply potential Vss and conducts when the control signal inputted to the gate thereof is the high potential Hi thereby to supply the power supply potential Vss to the power supply line DSL-(M−1).

If the transistor size of the P-channel transistor 162 in the output circuit 151-(M−1) is made smaller than that of the P-channel transistor 161, then the drop to the intermediate potential Vcc2 when the N-channel transistor 163 conducts becomes moderate. On the other hand, if the transistor size of the P-channel transistor 162 is equal to that of the P-channel transistor 161, then the drop to the intermediate potential Vcc2 becomes steep. Accordingly, if the transistor size of the P-channel transistor 162 is adjusted, then it is possible to set the gradient of a falling edge of the power supply potential and the intermediate potential Vcc2 so that the source potential Vs of the driving transistor 32 is substantially fixed for a period from time $t_{27}$ to time $t_{28}$.

[EL Panel 101 of the Third Embodiment]

Now, an EL panel 101 according to the third embodiment of the present invention is described.

Figure 17:
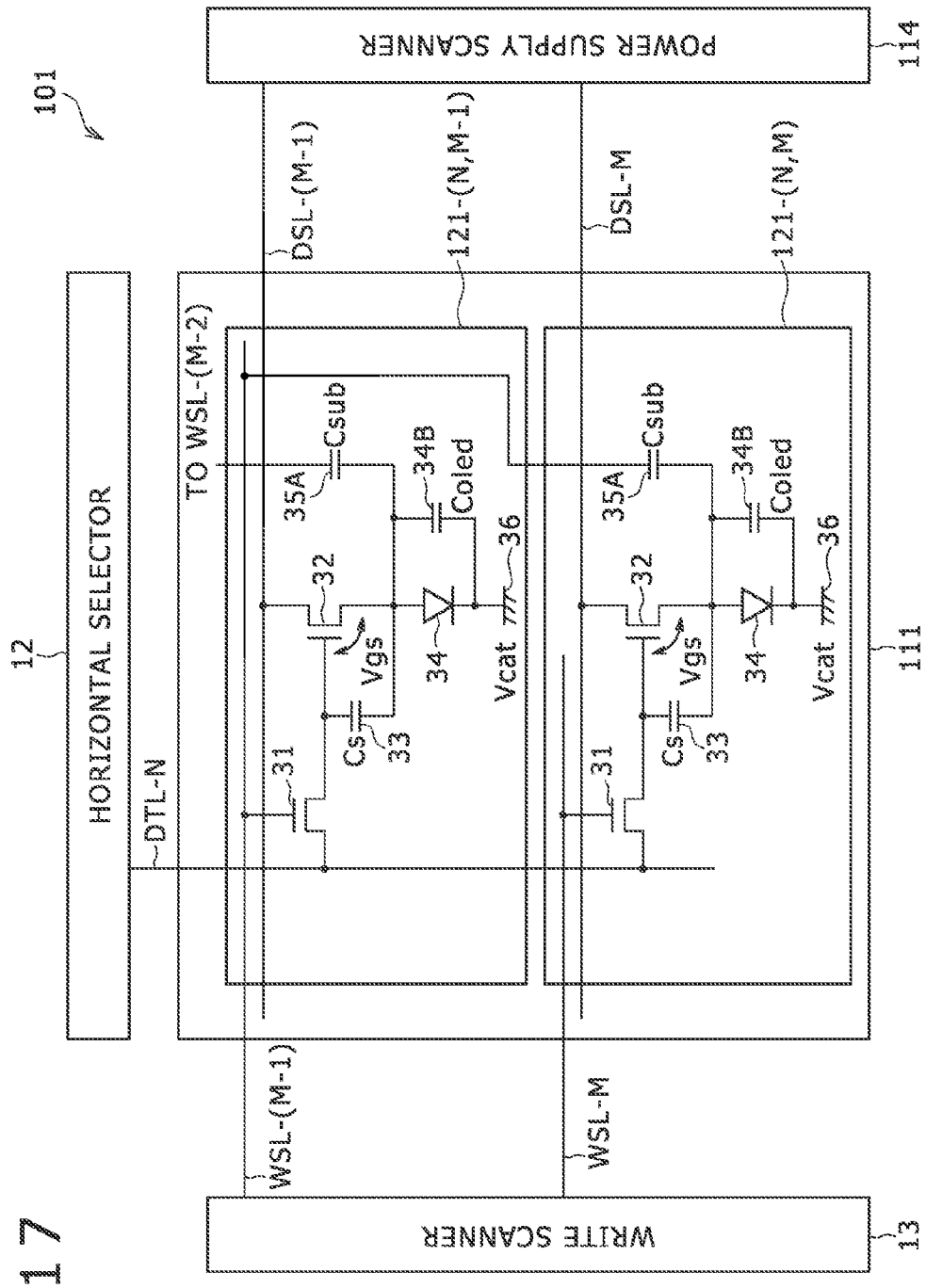
FIG. 17 is a block diagram showing an example of a configuration of an EL panel according to a third embodiment of the present invention.

FIG. 17 shows an example of a configuration of the EL panel 101 of the third embodiment.

Referring to FIG. 17, if the EL panel 101 shown is compared with the EL panel 101 of the first embodiment described hereinabove with reference to FIG. 9, then the EL panel 101 of FIG. 17 is similar in configuration to the EL panel 101 of the first embodiment except that it is different in the connection destination of one of the electrodes of the auxiliary capacitor 35A.

In particular, while, in the first embodiment, one of the electrodes of the auxiliary capacitor 35A of the pixel 121-(N, M) is connected to the power supply line DSL-(M−1) of the pixel 121-(N,M−1), in the third embodiment, one of the electrodes of the auxiliary capacitor 35A of the pixel 121-(N,M) is connected to the scanning line WSL-(N,M−1) of the pixel 121-(N,M−1). Also the auxiliary capacitor 35A of the pixel 121-(N,M−1) is connected, at the electrode thereof different from the electrode connected to the anode of the light emitting element 34, to a scanning line WSL-(N,M−2) of a pixel 121-(N,M−2) not shown. Also the auxiliary capacitor 35A of any other pixel 121 is connected at one of the electrodes thereof to the scanning line WSL of another pixel 121 at the preceding stage similarly.

Figure 18:
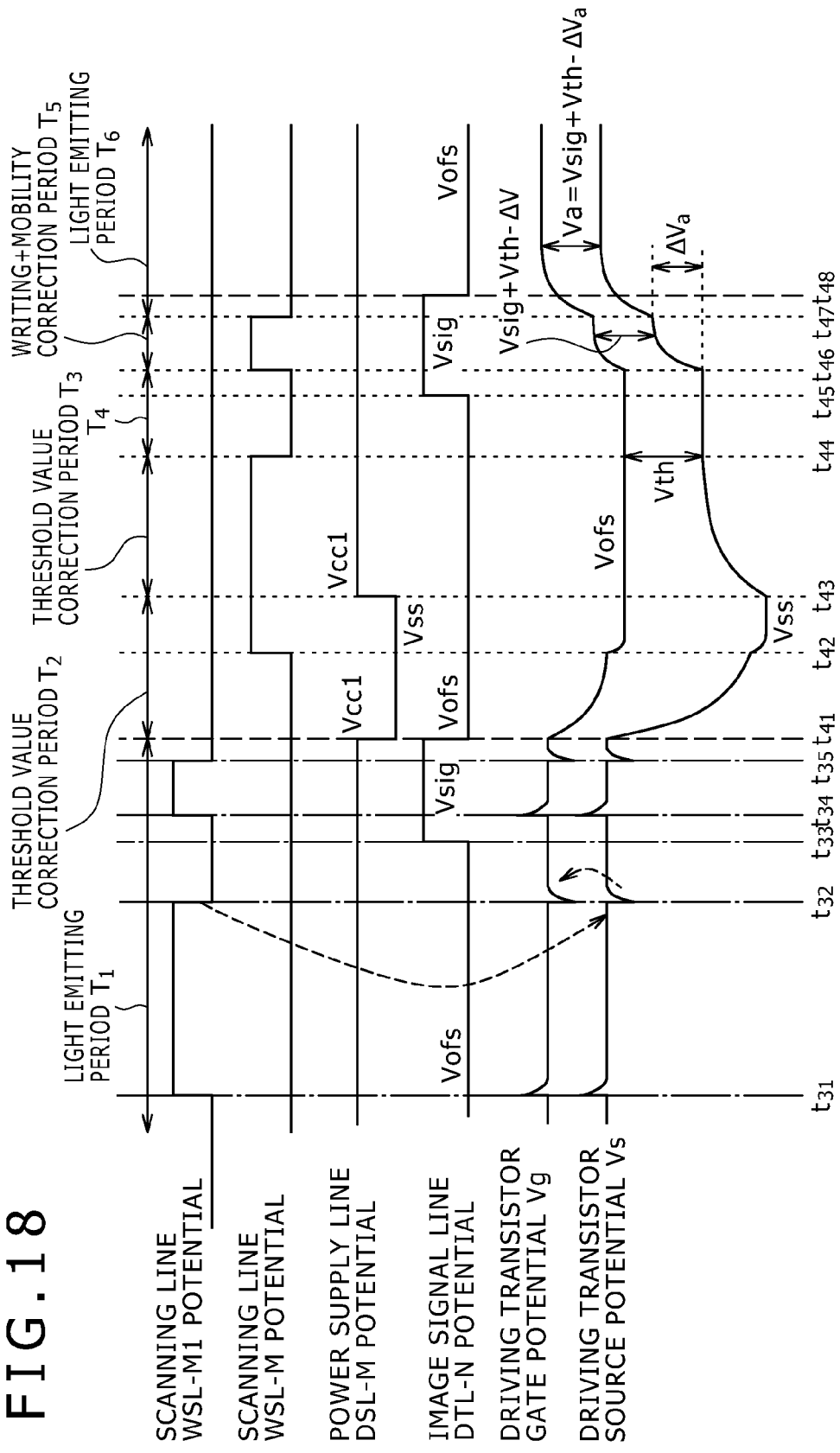
FIG. 18 is a timing chart illustrating operation of a pixel shown in FIG. 17.

FIG. 18 is a timing chart illustrates operation of the pixel 121-(N,M) of the EL panel 101 according to the third embodiment.

Driving control of the pixel 121 of the EL panel 101 of the third embodiment is similar to the driving control of the pixel 21 of the basic EL panel 10 described hereinabove.

In particular, operation other than the light emitting period $T_1$ and $T_6$ of the pixel 121-(N,M), within the period from time $t_{41}$ to time $t_{48}$ is same as the operation within the period from time $t_1$ to time $t_8$ of the basic EL panel 10 described hereinabove with reference to FIG. 7.

However, in the EL panel 101 of the third embodiment, the auxiliary capacitor 35A of the pixel 121-(N,M) is connected at one of the electrodes thereof to the scanning line WSL-(N, M−1) of the pixel 121-(N,M−1) at the preceding stage. Therefore, the gate potential Vg and the source potential Vs of the driving transistor 32 vary in response to the potential variation of the scanning line WSL-(N,M−1) for the pixel 121-(N,M−1) prior to time $t_{41}$.

In particular, at time $t_{31}$, the write scanner 13 changes over the potential of the scanning line WSL to the high potential to turn on the sampling transistor 31 similarly as in the control of the scanning line WSL-(N,M) at time $t_{41}$. Further, at time $t_{32}$, the write scanner 13 changes over the potential of the scanning line WSL to the low potential to turn off the sampling transistor 31.

Further, at time $t_{34}$, the write scanner 13 turns on the sampling transistor 31 and then turns off the sampling transistor 31 at time $t_{35}$.

If the potential of the scanning line WSL varies, then also the source potential Vs of the driving transistor 32 connected to the scanning line WSL-(N,M−1) through the auxiliary capacitor 35A varies. Consequently, also the gate potential Vg of the driving transistor 32 connected to the source of the driving transistor 32 through the accumulating capacitor 33 varies in an interlocking relationship.

Figure 1A:
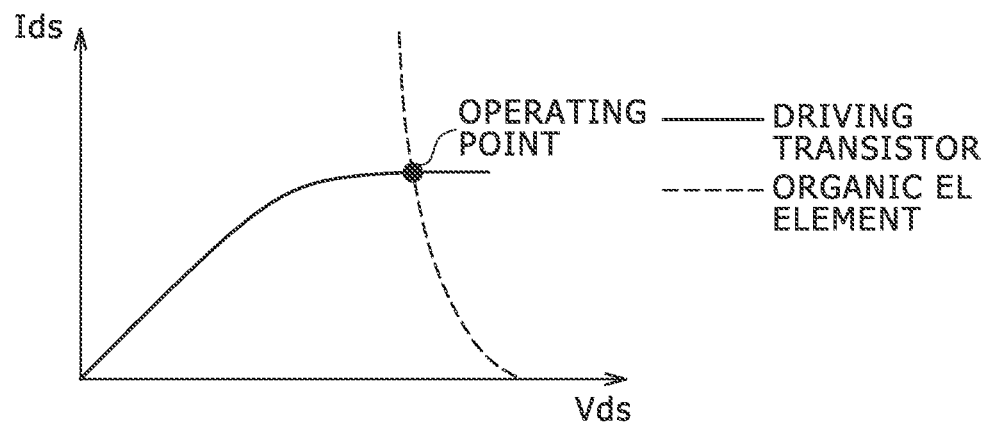
FIGS. 1A and 1B are graphs illustrating an operating point of a driving transistor and an organic EL element.
Figure 1B:
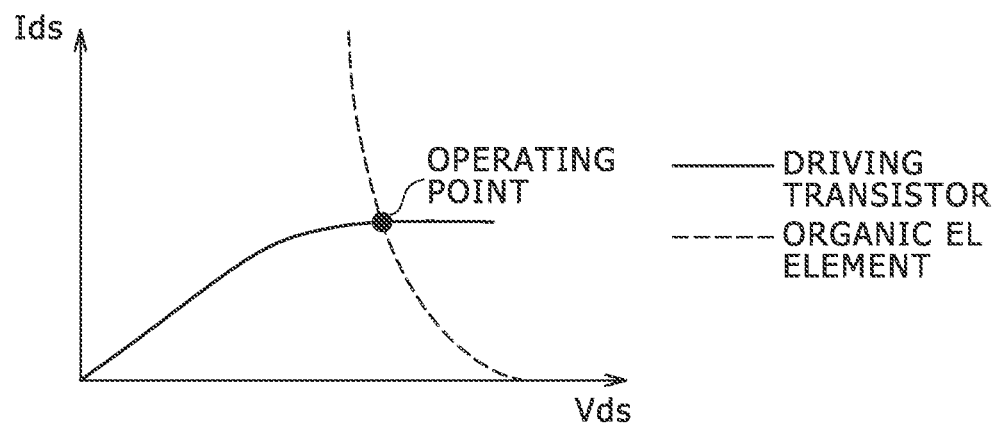

However, since the source potential Vs of the driving transistor 32 depends upon the operating point of the driving transistor 32 and the light emitting element 34 as described hereinabove with reference to FIG. 1, the gate potential Vg and the source potential Vs of the driving transistor 32 which have varied restore their original potentials. Accordingly, no influence is exerted on the pixel 121-(N,M).

Therefore, with the EL panel 101 of the third embodiment, the rise amount $\Delta V_a$ can be reduced in comparison with that in an alternative case wherein the auxiliary capacitor 35 is not provided similarly to the EL panel 10. Consequently, the gate-source voltage Vgs of the driving transistor 32 can be expanded. Further, where the gate-source voltage Vgs of the driving transistor 32 is expanded, the signal potential Vsig to be applied in accordance with a gradation can be reduced, and consequently, the power consumption can be reduced.

Further, where the auxiliary capacitor 35 is provided, increased time is required to charge up when the mobility correction operation is carried out, that is, to accumulate charge into the auxiliary capacitor 35 and the light emitting element capacitance 34B, and the rise of the source potential Vs of the driving transistor 32 becomes slower. In particular, since also the rise rate of the source potential Vs of the driving transistor 32 becomes moderate, also the dispersion of the emitted light luminance by the dispersion Δt of the pulse width of the selection controlling signal to be outputted from the write scanner 13 can be reduced.

The present invention is not limited to the embodiment described hereinabove and various modifications may be made without departing from the subject matter of the present invention.

While, in the example described above, one of the electrodes of the auxiliary capacitor 35A of a pixel 121 is connected to the power supply line DSL or the scanning lines WSL to another pixel 121 in the same column and at the preceding stage, one of the electrodes of the auxiliary capacitor 35A of a pixel 121 may otherwise be connected to the power supply line DSL or the scanning lines WSL for a pixel 121 which is in the same column and at the following stage, that is, in a turn later by one row distance in the order of line-sequential scanning. In particular, the electrode of the auxiliary capacitor 35A on the opposite side on which the auxiliary capacitor 35A is connected to the anode of the light emitting element 34 may be connected to the power supply line DSL to a pixel 121 adjacent in the direction of a column.

Further, while the pixel 121 is formed from a pixel circuit including two transistors and two capacitors as described hereinabove with reference to FIG. 9, it may be formed in some other circuit configuration. It is to be noted that the pixel circuit described is hereinafter referred to as 2Tr/2C pixel circuit.

Further, as a different circuit configuration of the pixel 121, for example, the following circuit configuration can be adopted. In particular, it is possible to adopt a configuration which includes first to third transistors in addition to a 2Tr/2C pixel circuit, that is, five transistors and two capacitors. The configuration just described is hereinafter referred to as 5Tr/2C pixel circuit. Where the pixel 121 adopts the 5Tr/2C pixel circuit, the signal potential to be supplied from the horizontal selector 12 to the sampling transistor 31 through the image signal line DTL is fixed to the signal potential Vsig. As a result, the sampling transistor 31 only functions to switch supply of the signal potential Vsig to the driving transistor 32. Further, the potential to be supplied to the driving transistor 32 through the power supply line DSL are the high potential Vcc1 and the intermediate potential Vcc2. Further, the first transistor newly added switches supply of the high potential Vcc1 to the driving transistor 32. The second transistor switches supply of the low potential Vss to the driving transistor 32. Further, the third transistor switches supply of the reference potential Vofs to the driving transistor 32.

Further, as another different circuit configuration of the pixel 121, an intermediate configuration between the 2Tr/2C pixel circuit and the 5Tr/2C pixel circuit may be adopted. In particular, a configuration which includes four transistors and two capacitors, that is, a 4Tr/2C pixel circuit, or a configuration which includes three transistors and one capacitor, that is, a 3Tr/2C pixel circuit, can be adopted. The 4Tr/2C pixel circuit may be configured such that, for example, the third transistor of the 5Tr/2C pixel circuit is omitted and the signal potential to be supplied from the horizontal selector 12 to the sampling transistor 31 is formed as a pulse signal using the signal potential Vsig and the reference potential Vofs.

The present application contains subject matter related to that disclosed in Japanese Priority Patent Application JP 2009-116099 filed in the Japan Patent Office on May 13, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display apparatus, comprising a driving section and at least a first and a second pixel,
   each of the first and the second pixel including:
   a light emitting element adapted to emit light in response to driving current,
   a sampling transistor adapted to sample an image signal,
   a driving transistor adapted to supply the driving current to said light emitting element, and
   an accumulating capacitor connected to a control node of the driving transistor,
   wherein the driving section is configured to operate the first pixel to execute a correction operation, by extracting a current through the drive transistor and feeding the current back to the accumulating capacitor of the first pixel such that a voltage data stored in the accumulating capacitor of the first pixel depends on both of the image signal and a characteristic information of the drive transistor, and
   the driving section is further configured to gain the voltage of the accumulating capacitor of the first pixel, during the correction operation, by changing a potential of a wiring line connected to the second pixel and coupled to the accumulating capacitor of the first pixel.

2. The display apparatus according to claim 1, wherein the wiring line is coupled to the accumulating capacitor of the first pixel via an auxiliary capacitance connected between the wiring line and the accumulating capacitor of the first pixel.

3. The display apparatus according to claim 1, wherein the driving section is further configured to boost a voltage of the accumulating capacitor of the first pixel by temporarily lowering the potential of the wiring line, is the wiring line being coupled to the lower potential node of the accumulating capacitor of the first pixel.

4. The display apparatus according to claim 3, wherein, when the driving section temporarily lowers the potential of the wiring line, a gradient of a falling edge of the potential of the wiring line and an intermediate potential to which the potential of the wiring line is lowered are set by the driving section such that a source potential of the driving transistor of the first pixel is substantially fixed while the potential of the wiring line is temporarily lowered.

5. The display apparatus according to claim 1 further comprising a first power supply line connected to the first pixel and a second power supply line connected to the second pixel, and the wiring line being the second power supply line.

6. The display apparatus according to claim 2 further comprising a first power supply line connected to the first pixel and a second power supply line connected to the second pixel, and the wiring line being the second power supply line.

7. The display apparatus according to claim 5, wherein the first power supply line and the second power supply line are respectively configured to control the supply of the driving current to the light emitting element via the drive transistor, in each of the first and the second pixel.

8. The display apparatus according to claim 1, wherein the wiring line elongates to a first direction, and the second pixel is disposed adjacent to the first pixel in the second direction substantially perpendicular to the first direction.

9. The display apparatus according to claim 1, wherein the wiring line is coupled to the first pixel without direct conductive connection.

10. A display apparatus, comprising a driving section and a pixel array section including:
    a plurality of pixels disposed in rows and columns;
    a plurality of potential lines; and
    a plurality of scanning lines,
    wherein each of said plurality of pixels includes:
    a light emitting element adapted to emit light in response to driving current,
    a sampling transistor adapted to sample an image signal,
    a driving transistor adapted to supply the driving current to said light emitting element,
    an accumulating capacitor connected to a control node of the driving transistor, and adapted to retain a predetermined potential,
    each of the potential lines is respectively connected to the pixels in each row,
    the accumulating capacitor of each of the plurality of pixels is coupled to the potential line for an adjacent pixel, and
    the driving section is adapted to execute a correction operation in the plurality of pixels, and is adapted to temporarily change, during the correction operation for a given one of the plurality of pixels, the potential of the potential line for the adjacent pixel that is coupled to the accumulating capacitor of the given one of the plurality of pixels.

11. The display apparatus according to claim 10, wherein the accumulating capacitor of the given one of plurality of pixels is coupled to the potential line for the adjacent pixel via a coupling capacitor.

12. The display apparatus according to claim 11, wherein said potential line for the adjacent pixel is the potential line for a pixel disposed adjacent to the given one of plurality of pixels in the column direction.

13. The display apparatus according to claim 11, wherein said potential line for the adjacent pixel is the potential line for a pixel adjacent to of the given one of plurality of pixels in the row direction.

14. A method of driving a display apparatus that includes at least a first and a second pixel, each of the first and the second pixel including a light emitting element adapted to emit light in response to driving current, a sampling transistor adapted to sample an image signal, a driving transistor adapted to supply the driving current to said light emitting element, and an accumulating capacitor connected to a control node of the driving transistor, the method comprising:
    performing a correction operation for the first pixel comprising extracting a current through the drive transistor of the first pixel and feeding the extracted current back to the accumulating capacitor of the first pixel such that a voltage data stored in the accumulating capacitor of the first pixel depends on both of the image signal and a characteristic information of the drive transistor of the first pixel, and
    while performing the correction operation, boosting the voltage of the accumulating capacitor of the first pixel by changing a potential of a wiring line connected to the second pixel and coupled to the accumulating capacitor of the first pixel.

15. The method according to claim 14, wherein boosting the voltage of the accumulating capacitor of the first pixel is accomplished by temporarily lowering the potential of the wiring line.

16. The method according to claim 15, further comprising, when temporarily lowering the potential of the wiring line, controlling a gradient of a falling edge of the potential of the wiring line and an intermediate potential to which the potential of the wiring line is lowered such that a source potential of the driving transistor of the first pixel is substantially fixed while the potential of the wiring line is temporarily lowered.

* * * * *